US008484590B2

(12) United States Patent
Newcomb

(10) Patent No.: US 8,484,590 B2
(45) Date of Patent: Jul. 9, 2013

(54) METHOD OF PREDICTING ELECTRONIC CIRCUIT FLOATING GATES

(76) Inventor: Jesse Conrad Newcomb, Daly City, CA (US)

( * ) Notice: Subject to any disclaimer, the term of this patent is extended or adjusted under 35 U.S.C. 154(b) by 0 days.

(21) Appl. No.: 13/345,721

(22) Filed: Jan. 8, 2012

(65) Prior Publication Data
US 2012/0110528 A1 May 3, 2012

Related U.S. Application Data

(63) Continuation-in-part of application No. 12/694,199, filed on Jan. 26, 2010, now Pat. No. 8,225,251.

(60) Provisional application No. 61/183,405, filed on Jun. 2, 2009, provisional application No. 61/476,320, filed on Apr. 17, 2011, provisional application No. 61/543,395, filed on Oct. 5, 2011.

(51) Int. Cl.
G06F 17/50 (2006.01)
(52) U.S. Cl.
USPC ............. 716/106; 716/100; 716/101

(58) Field of Classification Search
USPC .......................... 716/100, 101, 106
See application file for complete search history.

(56) References Cited

U.S. PATENT DOCUMENTS 8,225,251 B2 * 7/2012 Newcomb ..................... 716/106

* cited by examiner

Primary Examiner — Sun Lin
(74) Attorney, Agent, or Firm — Stephen E. Zweig

(57) ABSTRACT

Software method to identify which transistor gates float, and why, in complex, multi-transistor, electronic circuit designs. Transistor gates suspected of floating are analyzed by expanding backwards to build a logical tree representation of the previous predecessor circuit portions which drive that suspect gate. The method checks if the previous level of predecessor circuit node states earlier in the circuit show up more than once with different values, thus indicating by logical conflict that a particular floating suspect gate does not float. It then repeats this back-trace analysis for the next previous level of predecessor circuit portions, further seeking logical conflicts within the expanding logic tree. This is continued until either no predecessor circuit portion that can cause the suspect gate to float is found, or until a portion that does cause the suspect gate to float is found, in which case the suspect gate is identified as a probable floating gate.

25 Claims, 14 Drawing Sheets

METHOD OF PREDICTING ELECTRONIC CIRCUIT FLOATING GATES

CROSS REFERENCE TO RELATED APPLICATIONS

This invention is a continuation in part of patent application Ser. No. 12/694,199, "Circuit States", inventor Jesse Conrad Newcomb, filed Jan. 26, 2010, now U.S. Pat. No. 8,225,251; application Ser. No. 12/694,199 in turn claimed the priority benefit of U.S. provisional application 61/183, 405, "Floating Gate Predictor", inventor Jesse Conrad Newcomb, filed Jun. 2, 2009; this application also claims the priority benefit of U.S. provisional application 61/476,320, "Analysis of Electronic Circuits", Inventor Jesse Conrad Newcomb, filed Apr. 17, 2011; this application also claims the priority benefit of U.S. provisional application 61/543, 395, "Analyzer of Electronic Circuits", Inventor Jesse Conrad Newcomb, filed Oct. 5, 2011; the contents of all these applications are incorporated herein by reference.

BACKGROUND OF THE INVENTION

1. Field of the Invention

Embodiments of the present invention relate in general to the field of electronic circuits, in particular to computer software methods of detecting errors in electronic circuit designs.

2. Description of the Related Art

Electrical engineers often need to verify that a circuit will function properly, before it is fabricated as an integrated circuit. The most common way of doing this is to use simulation software, such as SPICE. However, there are many situations where an electrical circuit may have potential faults that will not be detected or predicted by simulation. Hence, the engineer often wants to employ additional checking on the circuit, using topology as an alternative to time domain simulation.

One of the most common types of circuit checks is to verify that a particular device, such as a transistor, is adequately (not improperly) connected. Standard industry practice is to subject a circuit design to peer review, wherein one might discover, upon inspection of schematics, that a transistor may be connected to a source of voltage that is too high for the ratings of that particular given device. Other common circuit checks include: inspection of transistor gate terminals to make sure they're tied to valid signals, inspection of power supply nets to make sure they're not shorted to ground nets, inspection of signal outputs to make sure they're driving the appropriate inputs elsewhere, and so on.

Modern electronic circuits, such as integrated circuit chips can often be composed of hundreds of millions of electrical components. These can include a diversity of electronic devices (e.g. field effect transistors (FET), metal oxide semiconductor field effect transistors (MOSFET), bipolar junction transistors (BJTs), and other sub-circuits, often formed from various types of simpler transistor-based circuits. Such chips are highly complex to both design and debug. As a result, there has been a substantial amount of prior art interest in both computer software methods to design complex electronic circuits, and as computer software methods to simulate the function of these complex electronic circuits.

A "net" is a term for a circuit connection that ties multiple electrical device pins together (in math terms and graph traversal terms, this is called a "node"). A whole circuit consists of many such nets (e.g. $net_1, net_2, net_3 \ldots net_n$). When a circuit is represented in the form of a computer storage file, it is usually called a "netlist". It is usually easier to at least begin analyzing more complex electronic circuits at the netlist level, and thus the computer software used to analyze such electronic circuits is sometimes referred to as "netlist analyzers".

One of the most common electronic devices in circuits is the field effect transistor, or "FET". A FET can generally be thought of as providing a valve or regulatory function, where the amount of current passing through the device is controlled by its gate terminal, or "gate". Because gates are the controlling points of the regulatory functions that FETs provide, they are of critical importance in the operation of a circuit.

As might be imagined, when highly complex integrated circuit chips are designed, their complexity soon outstrips the ability of both the human mind (and even sophisticated computer circuit design software) to understand and detect all design problems. One design problem that has been particularly difficult for prior art methods to detect and analyze is when, often due to an unintended design oversight, floating FET gates, essentially non-functional or improperly functioning portions of the circuit, are created. In a sense floating gates act somewhat like uninitialized variables in software, because their function is unpredictable (they control FETs in an unpredictable way). Floating gates can cause a complex circuit to either fail outright or act in an erratic and undesired manner.

In the typical electronic circuit, almost all nodes have at least some DC (direct current, or current-conducting) pathways, usually through devices such as transistors or resistors, to other nodes. In unusual cases, a circuit node will exist that does not have such DC pathways, or has only DC pathways that are of an impedance that is high enough that no significant current flow can take place to or from that node. These infinite-impedance or high-impedance nodes can be thought of as isolated, or "floating" nodes. A node is floating if it does not have a path that can source or sink any significant amount of current to or from other parts of the circuit, ultimately reaching one or more power supplies in the circuit. Furthermore, two or more nodes may form a floating island together, where such nodes have DC pathways between them, but no significant DC pathways to other parts of the circuit. Thus, a floating node may exist by itself, or may exist in conjunction with others. Floating nodes can be time dependent, where at some time (e.g. some circuit clock cycles, or during some time-dependent circuit sates) a DC path to or from the node is interrupted and can no longer conduct significant current.

Floating gates generally can arise when a transistor gate (gate) is not connected to any source of direct current, such as a driver (e.g. the gate may be connected to another gate or various passive devices, but there is no DC path between the gate and the circuit power or ground). Floating gates can also arise when the signal path to a gate is cut, for example by a transfer switch that has been cut off, or when driver power to the gate is disabled. Floating gates are a risk in the circuit industry, for one floating gate in an otherwise properly designed integrated circuit chip may cause reduced functionality or even permanently kill a circuit.

What makes floating gates particularly hard to detect is that often such portions of the circuit only float, i.e. become high-impedance, under certain conditions (e.g. high-impedance conditions). Under other conditions the circuit may operate normally. Even if the high-impedance conditions are reached, the circuit may still not show any apparent symptoms of failure at that time, because the very nature of floating gates is to manifest random behavior.

Another factor that makes floating gates difficult to both detect and analyze is that often, particularly with complex circuits, a design feature (e.g. a root "cause") in one part of the circuit tends to create a floating gate (e.g. an undesired "effect") in another part of the circuit. When the "cause" and "effect" are close together, the problem is easier to spot, but as they become more remote from each other, the problem becomes harder and harder for prior art circuit analysis or netlist analyzer tools to detect.

Because large circuits have a complexity that goes beyond the scope of what can normally be inspected by humans during schematic review, it is common practice for an engineer to employ programming techniques (e.g. software program based analysis methods) to accelerate circuit inspection, by using the circuit netlist or schematic to perform automated processing and analysis. Indeed, various prior art circuit design and analysis software programs (such as the open source, non-proprietary Gnu EDA, www.gpleda.org) provide utilities to form a circuit database and execute queries on the circuit structure, such as to check connections. Furthermore, using prior art methods, an engineer may create a script based on PERL, Tcl, or similar language to read a netlist directly and look for invalid constructs or connections. Examples of such code are also known and can be widely found on the internet.

Thus although there are various types of prior art software simulation methods, exemplified by the popular SPICE software family, which can take as inputs a description of a circuit (e.g. a net list) as well as a description of a particular type of defined test procedure (i.e. a set of test vectors), these prior art software simulation methods are limited in that if the proper series of tests (test vectors) is not run, then problems such as floating gates may be missed. Unfortunately, it is often far from obvious to determine what the optimal set of test vectors are for any given circuit, and thus at present, floating gate problems are often missed, resulting in much wasted time and resources. Thus improvements in software computer circuit analysis are desirable.

BRIEF SUMMARY OF THE INVENTION

The invention is based, in part on the insight that a key limitation of prior-art, software-based, circuit analysis and simulation methods, such as SPICE, is that these methods are only as good as the quality of the test vectors (e.g. test conditions) used to analyze any given circuit. As circuit complexity grows ever higher, it becomes less and less feasible to design and simulate all possible test vectors, and thus circuit design problems can be missed.

Put alternatively, for complex designs, trying to find floating gates by inputting the entire circuit design (circuit netlist) into the software simulator, along with a huge number of test vectors, and attempting to analyze the results by running a huge number of conventional simulations, can fail to find all problems because there are too many possible test vectors.

The invention is also based, in part, on the insight that for this type of problem, it may be useful to depart from prior art circuit analysis and simulation methods, and instead try to analyze a complex electrical circuit by working backwards. That is, start with the circuit design itself, ideally eliminate gates that can be shown not to be floating, define a more limited set of "suspect gates", and then work backwards from this smaller number of suspect gates to determine how, or under what conditions, the suspect gate can be made to float. Often the suspect gate will be found ultimately not to float, in which case if it can be eliminated as a suspect gate, but if the suspect gate can be made to float, then the suspect gate is now a "candidate floating gate".

Analog simulation methods such as SPICE are almost always used for critical circuit validation because analog methods predict the device-level behavior (rather than digital simulation, which simplifies operations into binary states). However, analog simulation methods become computationally very intensive as circuit complexity grows, making it infeasible to use SPICE methods to detect floating gates in complex circuits. How can this problem be resolved?

The invention is also based, in part, on the insight that for this working-backwards type approach, the computational intensity of the analysis can be considerably reduced, while still giving meaningful and accurate results, by reducing the inherently analog behavior of even digital circuits to a more simplified digital value for the purpose of the backwards analysis from floating suspect gates. This is possible because a floating gate determination generally produces a logical type "yes"/"no" type result. Thus for example, although a gate will float when its signal path is completely cut, if the signal is not completely cut, the gate will not float regardless of voltage value. Thus to ascertain a float condition with a good degree of accuracy, the invention's software need only test logical conditions; those conditions where a gate is either completely cut or not completely cut. This level of abstraction from complex SPICE calculations to simpler logical rules can, in conjunction with a backwards analysis that starts from floating suspect gates, greatly expedite the process of floating gate detection.

In essence then, this software-based process of working backwards from individual suspect gates works by creating, for each floating suspect gate, a logical. The trunk, root, or base of this logical tree rests on (starts with) the particular floating suspect gate that is being evaluated. Based on this particular floating suspect gate, this logical tree creates an ever expanding series of branches (each from another circuit portion other than the suspect gate itself) that corresponds to how far backwards the analysis extends for this particular floating suspect gate. Further, by defining a set of suitable software rules (e.g. logic equations) designed to try to rule a particular suspect gate as to being "in" or "out" as to a potential floating gate status, the various probable floating gates can be rapidly identified by the invention's automated methods. Thus for a complex circuit with a large number of suspect floating gates, the invention will produce and analyze a correspondingly large number of different logical trees, often one logical tree per suspect gate.

Each node in a logical tree corresponds to a particular net (e.g. net$_n$) in the circuit. In logical trees these are called "nodes" while in circuit terms they may be called either "nodes" or "nets". Where a suspect floating gate is represented in a logical tree, that corresponds to the particular circuit node that connects that gate. Hence, in order to represent the placement of floating suspect gates in logical trees, these floating suspect gates will be called "gate nodes" rather than gates. Additionally, the scheme will follow the rule that if the node to which a FET gate is connected should be at any particular state, such as float, then the FET gate itself will also be at the same particular state.

Moreover, due to the invention's logical tree methodology, the other circuit portions that cause the gate node to float can be also identified by the invention's automated methods. This can help the circuit designer detect unforeseen dependencies between more distant circuit elements, and also help suggest methods to quickly resolve the problem.

In one embodiment, the invention may be a software method (e.g. a software netlist analyzer) to identify which gate nodes, such as those connected to FET gate terminals float, and why, in complex, multi-gate, electronic circuit designs. Gate nodes (here defined as being the circuit nets connected to FET gates, gate-like BJT base terminals, or for that matter any state of the net which has a contention or short circuit) suspected of floating are analyzed by back-trace analysis of the logical tree representation of the previous predecessor circuit portions which drive that suspect gate node. The method checks to see if the previous level of predecessor circuit node states earlier in the circuit show up more than once with different values, thus indicating by logical conflict that a particular floating suspect gate node does not float. The method's software then repeats this back-trace analysis for the next previous level of predecessor circuit portions, further seeking logical conflicts within the expanding logic tree. This "truthfulness of the net equation" process is continued until either no predecessor circuit portion that can cause the suspect gate node to float is found, or until a portion that does cause the suspect gate node to float is found, in which case the suspect gate node is identified as a probable floating gate node.

DETAILED DESCRIPTION OF THE INVENTION

Figure 1:
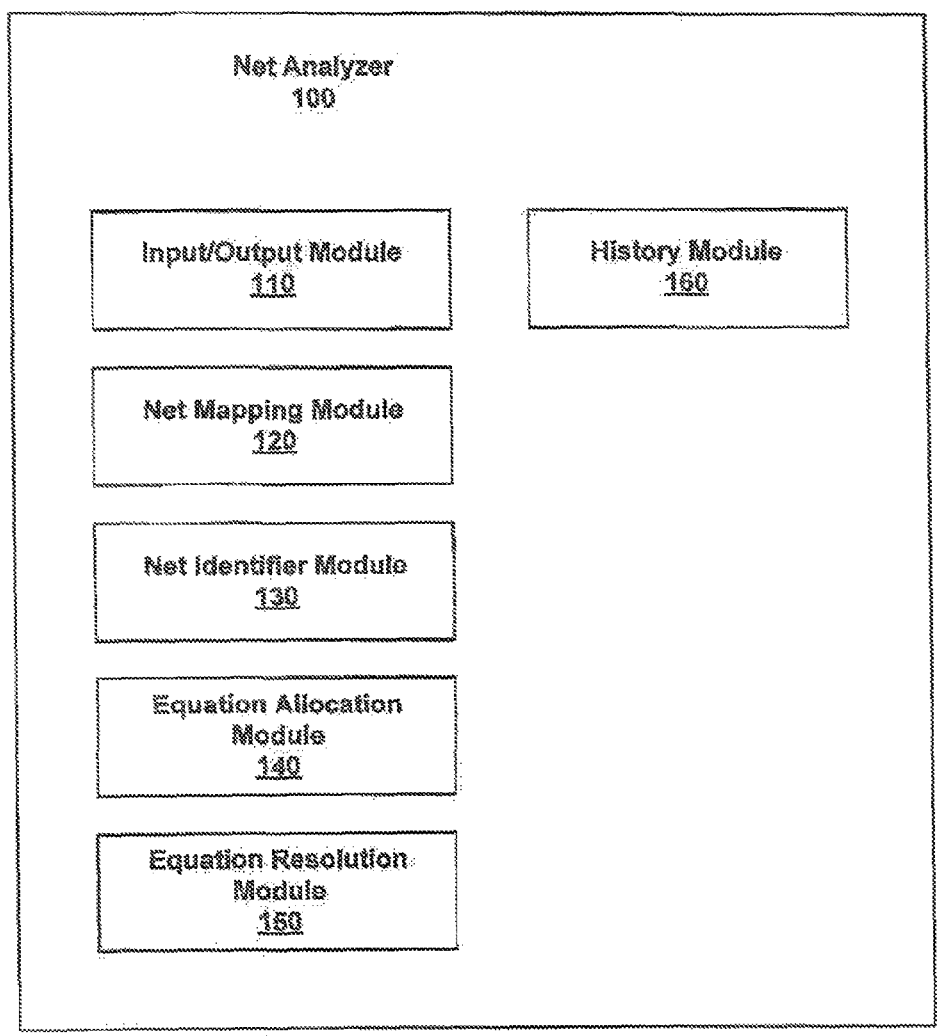
FIG. 1 illustrates a net analyzer upon which embodiments of the present invention may be implemented.

Nomenclature: In this discussion, the terms "node" and "net" will often be used interconvertably. The term "node" is a general term that refers to a single point at which components of an abstract graph, tree diagram, or electrical circuit are tied to each other. The term "net" is more specific to electrical circuits, and refers to the single point at which components of the circuit are tied to each other. The circuit layout or diagram for a complex integrated circuit chip with a large number of transistors and other circuit elements will often be described in the alternative as a "netlist". Likewise the electronic state (often time varying) of, for example, an integrated circuit chip will be described as a circuit state or states, and such state of a single specific point in the circuit as the "net state" or "node state". Likewise when the state of a given net is described by a proposal or hypothesis, this often will be discussed in the alternative as a "net equation". Thus an electronic circuit analyzer will often also be described as a net analyzer.

Specialized blocks: Specialized blocks are defined as small clusters of circuit elements that have a dedicated function, which appears in replication throughout the whole circuit. These specialized blocks can be characterized in terms of basic functions, and have specific output conditions that correspond to corresponding input conditions.

Truthfulness: As will be discussed in more detail shortly, the states of nets, or nodes, within a circuit may be represented by entries in a logical tree, in which values of various nodes in the circuit are shown, where the values are required to satisfy the logical tree. As will be discussed, the invention's software methods operate by progressing outward from selected floating suspect gates, progressively building a logical tree with the suspect gate as the trunk, and more and more levels of surrounding connected circuitry as the various branches of the tree, and at each level of the tree constructing logical equations for that particular level of the tree. The determination that a particular logical entry, along with its proposed value, can survive a logical proof without conflict, is occasionally referred to in shorthand form as the "truthfulness" of the particular node being analyzed.

The teaching herein can be used for both digital circuits, analog circuits, and hybrid digital/analog circuits. All electronic circuits, whether they are considered digital or analog electronic circuits, are, in fact, based upon electronic devices that are fundamentally analog. For example, if a digital inverter circuit is given an indeterminate voltage as input, then its output will also be indeterminate, likely non-digital. Thus when the term "analog circuit" is used herein, this is intended to remind the reader that even a digital circuit is composed of components with an inherently analog function. The term "analog circuit" is not intended to limit the invention to non-digital circuits, and indeed the invention will be highly useful for analysis of almost any digital circuit, such as a digital integrated circuit chip, or a mixed analog/digital chip as previously discussed.

As previously discussed, in one embodiment, the invention may be a software method (e.g. a software net analyzer) to identify which transistor gates float, and why, in complex, multi-transistor, electronic circuit designs. Gate nodes suspected of floating are analyzed by back-trace analysis of the logical tree (tree) representation of the previous predecessor circuit portions (which themselves are often composed of other transistors as well as other circuit components) which drive that suspect gate node. The method (e.g. the computer software and processors implementing the method) checks if the previous level of predecessor circuit node states (e.g. floating gate nodes, nodes driven high, nodes driven low) earlier in the circuit show up more than once with different values, thus indicating by logical conflict that a particular floating suspect gate node does not float. Put another way, if that particular floating suspect gate node can be shown to turn on and off consistently, it must be in a functional state rather than a floating state. The method then repeats this back-trace analysis for the next previous level of predecessor circuit portions, further seeking logical conflicts within the expanding logic tree. This is continued until either no predecessor circuit portion that can cause the suspect gate to float is found, or until a portion that does cause the suspect gate node to float is found, in which case the suspect gate node is now reidentified as a probable floating gate node. The larger circuit context in which this floating suspect gate node is embedded can also be reported. When desired, the offending predecessor circuit portion that was determined to cause the floating suspect gate node to float can also be reported.

Often the logical trees used in this invention will be Boolean logic trees, but non-Boolean (non-binary) logical trees, for example trees based on 0, 1, and Z values, may be also used for these purposes as needed.

Given that modern complex circuits, such as very large scale integrated circuits, can have hundreds of millions of transistors, in a preferred embodiment, it is often useful to initially do a first-pass analysis and determine which transistor gate nodes can clearly be shown to be non-floating. This can be done by using a first set of design rules to analyze the various gate nodes and determine which of these plurality of gate nodes are clearly OK (i.e. non-floating), and which of these plurality of gate nodes could potentially be floating (i.e. floating suspect gate nodes).

This first set of design rules, for example, can be based on knowledge that floating nodes are only of interest generally if they have a Field Effect Transistor (FET) gate directly connected to them. Further, not all transistor gate nodes are floating suspect gate nodes. When the gate node being investigated has inseparable global power, or is otherwise connected to a power source that is incompatible with a floating condition, then this gate node is not a floating suspect gate node. Other situations incompatible with float include situations where the transistor has gate tied around to its own source or drain as a diode, the transistor is tied as FET capacitor, the gate has a constant feedback path to the transistor's own power supply, the gate is part of a transistor that has no possible path to power or ground (without any power, the transistor does not present a risk if its gate is floating), and the like are also situations that can be quickly discarded during the optional but preferred first pass analysis.

Thus the first set of design rules pass can often safely discard situations where the suspect gate is tied to a transistor that is powered off during the time of the float, thus rendering the floating condition harmless, or other situations where the transistor of which gate is being analyzed is powered down during the otherwise floating condition.

Keep in mind that for a digital circuit, the analysis will often be done over a plurality of different circuit clock states and input values, and even for an analog circuit, the circuit state over a plurality of times or various circuit input values will often also be analyzed. Thus other conditions that can also be analyzed by the first set of design rules include situations where suspect or switched circuit power rails are examined. Here, for example, non-switched power rails tend not to be associated with floating nodes, and this type of situation can often also be excluded.

Put alternatively, this first set of design rules can scan the electronic circuit for nets that either have FET gates directly connected, or have FET gates reached through resistors, or through FET gates reached through DC passive devices. The first set of design rules can also comprise identifying at least one circuit subsection that is formed from the transistors being analyzed, and designating as known non-floating those gates in said at least one circuit subsection whenever said circuit subsection has a global power source or power ports that cannot generate a floating state. The first set of design rules can also comprise identifying gate nodes as known non-non floating gate nodes when these gates are tied around to their own transistor source or drain as a diode, or the gate is tied away from source and drain so as to form a FET capacitor, or the gate has a constant feedback path to its transistor's own power supply, or said gate is part of a transistor with no possible path to power or ground.

Once the number of gate nodes to be examined has been winnowed down to a reasonable number, the back trace expansion, and constructing logical trees of the predecessor circuit nodes that go into the gate node of interest can commence. Here a second set of design rules can be used to identify the floating suspect gate nodes. This second set of design rules will be discussed in more detail shortly.

More specifically then, in another embodiment, the invention may be a computerized software implemented method to identify both specific floating gate nodes and causes of these specific floating gate nodes in an electronic circuit design or netlist. The inventions software methods (e.g. net analyzer), when provided with the electronic circuit design to be analyzed, will generally do the following:

1: Use a first set of design rules, as previously discussed to first analyze this plurality of gate nodes and determine which of these gate nodes are known (can be shown) to be non-floating, and which of these gate nodes remain floating suspect gate nodes.

2: For each of these floating suspect gate nodes for which analysis is desired, performing a logic tree expansion to create a logic tree representation of the previous level of predecessor circuit portions (e.g. predecessor transistor gate nodes, power rails, other components) that drive the state of that particular floating suspect gate node. The software will determine if any these predecessor circuit node states in the previous level of predecessor circuit portions show up more than once with different values. If so, this logical conflict is inconsistent with a floating state status (e.g. this particular node is switching consistently), and indicates that this particular floating suspect gate node does not actually float. This particular situation can then be marked as harmless and the analysis can continue.

3: The software will then repeat this logic tree expansion for the next previous level of predecessor circuit portions, again seeking logical conflicts within the expanding logic tree. This process of going to the next previous level and repeating the logic tree expansion (essentially going to higher and higher branches in the logic tree) will generally continue until it can be determined that either no combination of predecessor circuit portions can cause said floating suspect gate node to float, or until a predecessor circuit portion that does cause said floating suspect gate node to float is identified. Alternatively, the operator, as desired, may arbitrarily cut off the analysis after a certain level in the tree has been reached, and of course if the tree extends to cover the entire circuit, this will also cause the analysis to terminate. The software can also do this logic tree expansion over a plurality of clock cycles or circuit input parameters.

4: If a predecessor circuit portion that does cause said floating suspect gate node to float is identified, then the software will generally report the identity of this floating suspect gate node as a probable floating gate node. It will also usually also report exactly which predecessor circuit portion caused this floating suspect gate node to float as the probable cause of the problem, as well as the clock cycle type or circuit input parameter associated with the problem. This information is of course quite valuable for circuit designers as it can then help them resolve the problem in subsequent circuit design iterations.

As previously discussed, a second set of design rules can be used to identify the floating suspect gate nodes. One example of such a second set of design rules is shown below:

Here, the floating suspect gate nodes can be further analyzed by having the invention's software (e.g. net analyzer) performing the following steps or operations, often with the aid of one or more circuit behavior equations, which will be discussed shortly. These steps can be:

A: Identifying at least one circuit subsection that includes the gate nodes being analyzed.

B: Applying finite state permutations to the inputs to said circuit subsection (e.g. varying the clock cycles or the various input parameters to this circuit subsection).

C: Electronically simulating the state of the relevant circuit subsection by treating the transistor components of said gates as switches, and allowing the state of said transistor components to settle.

D: Building a truth table of inputs and resulting outputs, wherein if an internal gate node in the circuit subsection is determined to be in a floating state, designating which these circuit subsection inputs cause said floating state to occur.

E: Building a truth table of inputs and resulting outputs, wherein if an output of the circuit subsection is determined to have continuous non-floating states under all conditions, designating this output for reference in subsequent analysis.

To reduce the number of technically floating but otherwise uninteresting gates that are being reported, the invention's software may also be programmed to ignore or not report gates that are in a floating condition when the whole transistor to which the gate belongs is powered off.

As previously discussed, when a floating gate node is found, the circuit or chip designers often want to know why the gate node floats. Thus, as previously discussed, often it will be desirable also, in situations where the electronic circuit has a plurality of power rails, to program the analysis software to further analyze the effect of switching these power rails on gates that are provided with constant power, as well as programming the software to search for victim gates that are affected by this switching. If such victim gates are found, then it is desirable to also report the problematic power rail switching as a cause of these floating gate nodes.

Various refinements on this basic method are also possible. For example, when doing the logic tree expansion, often it will be useful, when repeating this logic tree expansion for the next previous level of predecessor electronic circuit portions, to bias the analysis to preferentially favor (i.e. pursue those branches of the logical tree first) with predecessor electronic circuit portions where a transistor leads to power, where a transistor leads to a non-CMOS component at higher risk for floating, and where the transistor source or drain paths are followed before the following gate. It is also often useful to discriminate against (i.e. tend not to pursue those branches of the logical tree, or do only later, or even never do at all) portions of the circuits with transistors that do not lead to power or to floating states, or following the transistor gate signal after first establishing the source or drain paths. This way, by pursuing the most promising portions of the logical tree first, the analysis can be sped up, often by a considerable amount.

Similarly, it can also be useful (i.e. speed up the analysis) to further bias the logic tree expansion for the next previous level of predecessor electronic circuit portions to preferentially avoid (e.g. pursue those branches of the logical tree later, if at all) logic sub-circuits which yield known constant drive, and repetitive instances of similar components such as memory bit cells. This is because such regions of the circuit are less likely to float, and are thus comparatively uninteresting for this type of analysis.

Another refinement on the basic method is to isolate a specific portion, or sub-circuit, from the overall circuit, and then run the logic tree expansion with the additional limitation that the expansion should not grow outward past the boundary of the isolated sub-circuit. In many cases, imposing such a limit on the logic tree expansion, so as not to expand beyond a certain sub-circuit, can quickly determine that such a sub-circuit has been designed so that no floating gates can exist within. That is, all transistor gates within the given sub-circuit are guaranteed to be safe, by design, regardless of inputs to the sub-circuit. In such cases, where logic tree expansion is limited, a solution can be reached substantially faster than other cases where the logical tree is allowed to expand without limits to larger parts of the overall circuit.

Another refinement on the basic method is to combine the previously discussed refinements, executed at once for the benefit of a common floating suspect gate, in parallel computational threads or processes, where each thread (or process) has the ability to halt the others if a solution is found. Thus, one floating suspect gate node can be analyzed and solved by an array of complementary refinements on the basic method, and the earliest solution found allows the overall analysis of the whole circuit to more quickly advance to another suspect floating gate node.

As previously discussed, although the logic tree (often abbreviated as simply the "tree") need not be a Boolean logic tree, in some embodiments it will be a Boolean logic tree. Here, when the nodes in the previous level of predecessor circuit portions are those at the ultimate boundaries of the total circuit, these nodes will of course have no predecessors. In this case, these nodes have possibility of holding any circuit state to satisfy the Boolean conditions at their places in the logic tree, and the software can take this into account during its analysis.

As previously discussed, although the logic tree expansion can potentially extend out to the outer boundaries of the circuit, it may be useful to truncate the analysis after a certain tree depth to speed up the analysis, and help focus attention onto particular areas of the circuit being analyzed. In this situation, the software may be set so that if the logic tree analysis is unable to establish that a floating gate exists within a preset depth in the logic tree, then the software can either halt the analysis at a preset maximum tree depth level, and then list some or all of the tree leaf nodes at this preset maximum depth level, as well as report the floating suspect gate being analyzed still has having a possibility of floating at this preset depth.

Finally, in addition to the specific second set of design rules previously discussed, other design rules may also be added to this second set of design rules as needed in order to better to identify floating suspect gate nodes or probable floating gate nodes.

Additional discussion of some of the basic design principles and consideration behind the invention may also be found in the detailed discussion later in the specification.

EXAMPLES

Reference will now be made in detail to various embodiments of the present invention, examples of which are illustrated in the accompanying drawings. While the present invention will be described in conjunction with the various embodiments, it will be understood that they are not intended to limit the invention to these embodiments. On the contrary, embodiments are intended to cover alternatives, modifications and equivalents, which may be included within the spirit and scope of the appended claims. Furthermore, in the following description of various embodiments, numerous specific details are set forth in order to provide a thorough understanding of embodiments. However, it will be recognized by one of ordinary skill in the art that embodiments may be practiced without these specific details. In other instances, well known methods, procedures, components, and circuits have not been described in detail as not to unnecessarily obscure aspects of the embodiments.

In various embodiments, a net analyzer is discussed. The net analyzer may be used to determine if a transistor gate floats by determining if a net, electrically coupled to the gate, floats. The net is determined to float or not to float by using net equations.

FIG. 1 illustrates a net analyzer 100 upon which embodiments of the present invention may be implemented. In one embodiment, the net analyzer 100 comprises an input/output module 110, a circuit construction module 120, a net identifier module 130, a net equation allocation module 140, a net equation resolution module 150, and a history module 160. In other embodiments, modules of the net analyzer 100, are merged and/or performed outside the net analyzer 100.

The input/output module 110 receives circuit configuration information and returns circuit, node and/or net information to a user. The circuit information contains a netlist and/or information regarding a circuit, such as specifications and configurations of nodes, nets, and the like. The circuit information may be in a standard format, such as SPICE, or any other format that has specification entries for nodes, nets, devices, and the like. The returning information may be formatted for use in a spreadsheet, for display on a terminal, and the like.

The circuit construction module 120 receives the circuit information from the input/output module 110. In one embodiment, the circuit construction module 120 converts circuit information to an internal circuit. The internal circuit is a memory footprint of nets, pins, devices, and the like. After which, the net analyzer 100 traverses and queries the internal circuit to obtain objects and/or information as needed. For example, nets from a netlist are placed in memory, associated with names from the netlist, and coupled with relevant device connections also from the netlist.

The net identifier module 130 identifies nets that may potentially float and/or are susceptible to float. The net identifier module 130 determines a potential to float by querying the circuit construction module 120 to determine which nets are connected to FET gates, have constant connections, such as a power tie, and the like. A net with only FET gates connections has a potential to float. A net with a connection to a constant power tie will not float, thereby making a test for floating unnecessary. A net with connections to FET gates and other devices, such as resistors, and the like, may have a potential to float.

In one embodiment, after the net identifier module 130 determines one or more nets that have a potential to float, the nets are mapped to equations to determine if they may float, as discussed herein. In another embodiment, nets are mapped after the net identifier module 130 determines has finished determine the float potential of the nets.

The equation allocation module 140 receives a net from the net analyzer 100 to be characterized with a net equation. The net equation represents a proposed net state (e.g. hypothesis) using one or more states of other nets. The proposed net state and the one or more states of other nets are float/floating, high, or low. For example, Net 1 is postulated to float (equal to Z) if and only if Net 2 is low (equal to 0) and Net 3 is high (equal to 1). The one or more equations of the other nets are determined to be true, false, or possible. For example, if a Net is equated to be high, that is Net=1, and the Net is always low or floats, then the hypothesis of [Net=1] is possible, where possible may mean:

Net proposed=1, Net actually 0, so hypothesis is false.
Net proposed=1, Net actually 1, so hypothesis is true.
Net proposed=1, Net actually Z (able to take any state), so hypothesis is possible.

Thus, a hypothesis of net state may be determined as possible, when it is possible that the proposed state is the actual state. A net state is determined by the equation resolution module 150 discussed below.

The equation resolution module 150 determines net states and resolves net equations. In one embodiment, the equation resolution module 150 communicates with the equation allocation module and the net identifier module 130. In another embodiment, the equation resolution module 150 communicates with the net analyzer 100. The equation resolution module 150 resolves a net equation by determining and/or resolving any logic combined with other net states in the equation. In one embodiment, a net equation is resolved by determining if the proposed net state is either true or false. For example, if the proposed net state is to float, and a basis to obtain a "float" is satisfied, then a net equation is resolved to be true, that is, the net may float.

In another embodiment, in addition to "true" and "false" a net state is resolved as "possible." The possible resolution may be assigned to a net hypothesis when certain conditions occur, such a time-out or time limit, a temporarily unresolved net equation, a depth limit, a width limit, and the like. The certain conditions may be identified as a predetermined event. In one embodiment, a forced stop, that is the time-out and/or time limit, may be user predetermined prior to the net analyzer 100 receiving circuit configuration information. In another embodiment, the time-out is determined on the fly via user response to a prompt, conditionally based, such as a complexity of a net equation, and the like. The temporarily unresolved net equation may be later resolved by additional user input, the net analyzer 100 making assumptions, such as forcing values to net states, and/or removing previously determined "suspicious" nets from the net equation. A suspicious net is a net that the net analyzer 100 identifies as a potential floating net and may be reported to the user.

The history module 160 stores net state information. The net state information contains information resolved by the equation resolution module 150. In one embodiment, the history module 160 communicates with the equation allocation module 140 to simplify the net equation. One simplification may be substitution of the resolved net state in place of the net state. For example, instead of added Net B equals "high" (the net state), insert "true" (the resolution of the net hypothesis) into the equation. In another embodiment, the history module 160 communicates with the equation resolution module 150, whereby the equation resolution module queries the history module 160 for previous net state resolutions. Net equations and net equation resolution are discussed with respect to FIGS. 2-4 and 7, and further herein.

In one embodiment, the net identifier module 130, the equation allocation module 140, the equation resolution module 150, and the history module 160 are combined into one or more modules. In another embodiment, the equation resolution module 150 and the history module 160 are combined into one module. It will be recognized by one of ordinary skill in the art that any combination of modules within the net analyzer 100 may be practiced without specific details of the functions within the modules, and is included within the spirit and scope of the embodiments.

Figure 2:
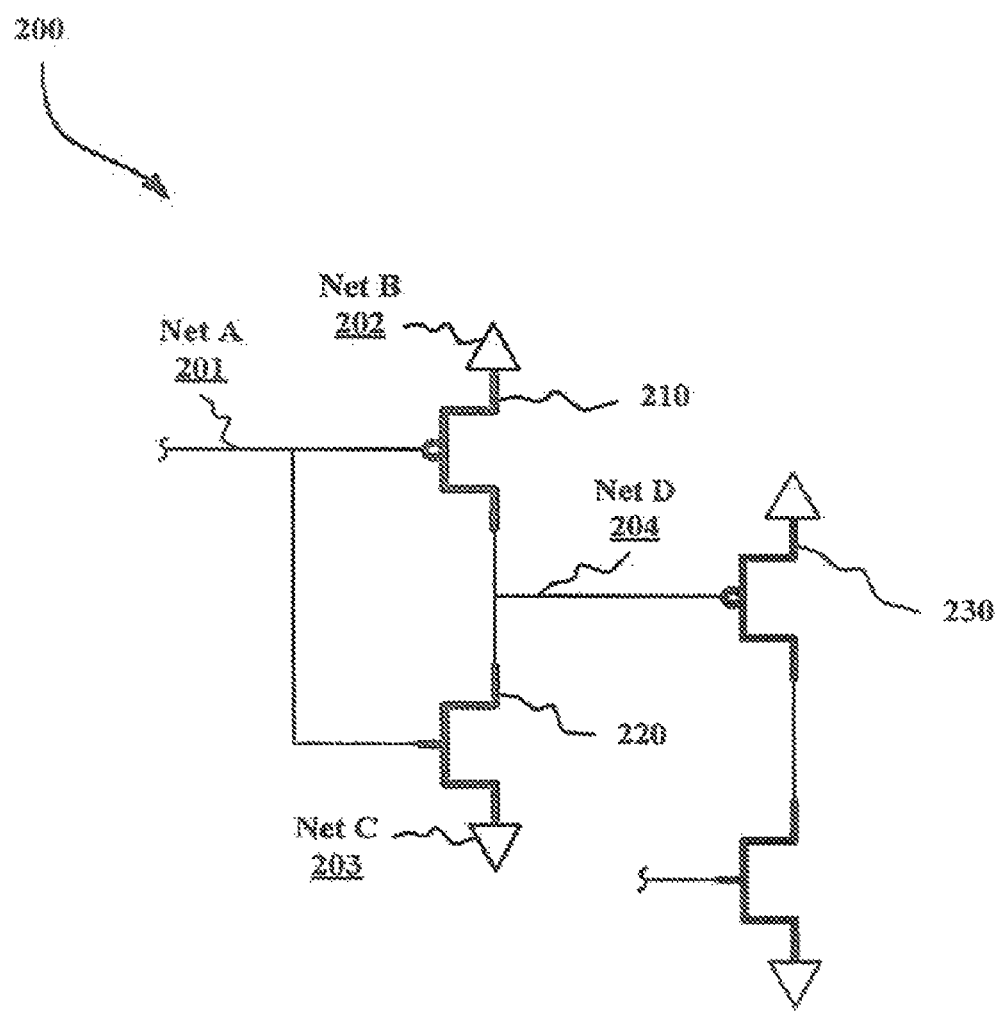
FIG. 2 illustrates an example to show that a net may not float, upon which embodiments of the present invention may be implemented.

FIG. 2 illustrates an example 200 to show that a net may not float, upon which embodiments of the present invention may be implemented. The example 300 shows Net A 201 coupled to device 210 and device 220, Net B 202 coupled to device 210, Net C 203 coupled to device 220, and Net D 204 coupled to device 210, device 220 and device 230. In the example 200, the net analyzer 100 determines that a gate of device 230 is coupled to the Net D 204, wherein the Net D 204 is coupled to devices that have varying states, and thereby may "suspect" that the gate of device 230 may float. To determine if the gate of device 230 may float, the net analyzer 100 assigns the proposed net state of "float" to Net D 204 represented by the expression:

$$\text{Net } D=Z \text{ if [device 210=}Z]\&[\text{device 220=}Z] \qquad (a)$$

wherein Z signifies "float"

As the net analyzer 100 knows device 210 is a PFET, a p-channel FET (field-effect transistor), the net analyzer 100 determines that in order for device 210 to float, either the gate needs to be "high" (that is, Net A 201 needs to be "high") or Net B 202 needs to float. Therefore, the net analyzer 100 may substitute the following expression into the above equation (a):

$$[\text{device 210=}Z] \text{ if [Net } A=\text{high]|[Net } B=Z] \qquad (b)$$

Also, as the net analyzer 100 knows device 220 is a NFET, an n-channel FET, the net analyzer 100 determines that in order for device 220 to float, either the gate needs to be "low" (that is, Net A 201 needs to be "low") or Net C 203 needs to float. Therefore, the net analyzer 100 may substitute the following expression into the above equation (a):

$$[\text{device 220=}Z] \text{ if [Net } A=\text{low]|[Net } C=Z] \qquad (c)$$

The substitution of equations (b) and (c) into (a) results in the following equation where Net D will float if:

$$[[\text{Net } A=\text{high]|[Net } B=Z]]\&[[\text{Net } A=\text{low]|[Net } C=Z]]$$

In the example 200, Net B 202 and Net C 203 are constant powers, whereby the net analyzer 100 removes constant powers, resulting in:

$$[\text{Net } A=\text{high]\&[Net } A=\text{low}] \qquad (d)$$

The net analyzer 100 evaluates expression (d) as a contradiction, thereby concluding that the proposed network state of "float" is false, that is, the gate of device 230 will not float under any conditions.

Figure 3A:
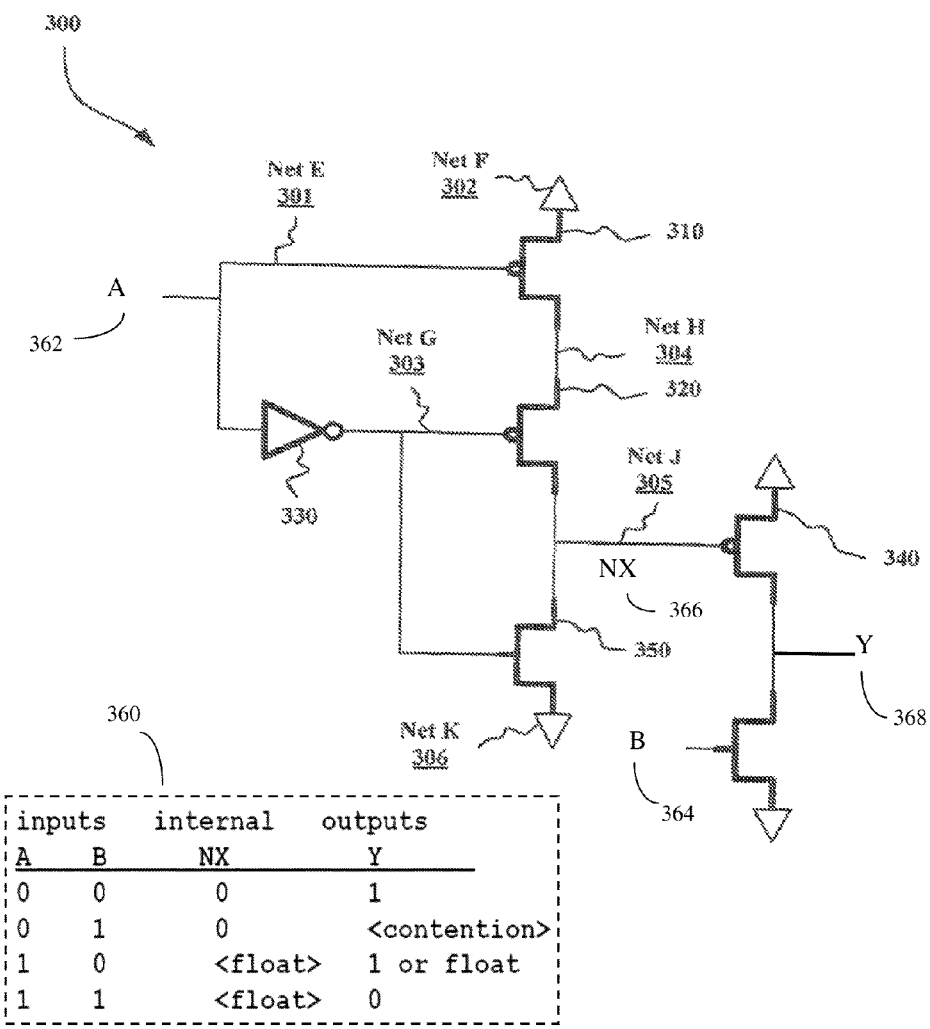
FIG. 3A illustrates an example to show that a net may float, upon which embodiments of the present invention may be implemented.

FIG. 3A illustrates an example 300 to show that a net may float, upon which embodiments of the present invention may be implemented. The example 300 shows Net E 301 coupled to device 310 and device 330, Net F 302 coupled to device 310, Net G 303 coupled to devices 320-330 and device 350, Net H 304 coupled to device 310 and device 320, Net J 305 coupled to device 320 and devices 340-350, and Net K 306 coupled to device 350. In the example 300, the net analyzer 100 determines that a gate of device 340 is coupled to the Net J 305, wherein the Net J 305 is coupled to devices that have varying states, and thereby may "suspect" that the gate of device 340 may float. To determine if the gate of device 340 may float, the net analyzer 100 assigns the proposed net state of "float" to Net J 305, wherein the hypothesis is "Does Net J float (equals Z)?", whereby the hypothesis of "Net J floats" is true if conditions are satisfied, that is, device 320 and device 350 float, and wherein the hypothesis is represented by the expression:

$$\text{Net } J=Z \text{ if [device 320=}Z]\&[\text{device 350=}Z] \qquad (e)$$

As the net analyzer 100 knows device 320 is a PFET, the net analyzer 100 determines that in order for device 320 to float, either the gate needs to be "high" (that is, Net G 303 needs to be "high") or Net H 304 needs to float. Therefore, the net analyzer 100 may substitute the following expression into the above equation (e):

$$[\text{device 320=}Z] \text{ if [Net } G=\text{high]|[Net } H=Z] \qquad (f)$$

Also, as the net analyzer 100 knows device 350 is a NFET, the net analyzer 100 determines that in order for device 350 to float, either the gate needs to be "low" (that is, Net G 303 needs to be "low") or Net K 306 needs to float. As the net analyzer 100 knows Net K 306 is a constant power and may not float, the net analyzer 100 does not include an equation "Net K=Z". Therefore, the net analyzer 100 may substitute the following expression into the above equation (e):

$$[\text{device 350=}Z] \text{ if [Net } G=\text{low}] \qquad (g)$$

The substitution of equations (f) and (g) into (e) results in the following equation where Net J will float if:

$$[[\text{Net } G=\text{high]|[Net } H=Z]]\&[[\text{Net } G=\text{low}]] \qquad (h)$$

The net analyzer 100 notices a contradiction of "Net G=high" and "Net G=low", and thereby may expand equation (h) into two equations, one for Net G high and one for Net G low, but as the equation requires net G to be low, the net analyzer 100 reduces the equation (h) by removing the "Net G=high", thus, Net J 305 will float if $$[\text{Net } H=Z]\&[\text{Net } G=\text{low}] \qquad (i)$$

The net analyzer 100 determines expression substitutions for Net H 304 to be: Net H=Z if Net E=high. The net analyzer 100 consults a lookup table, as discussed herein, to determine device 330 is an inverter and finds the inputs needed for Net G 303 would be Net E=high, thereby, Net G=low if Net E=high. Thus, making substitutions into equation (i), the net analyzer 100 determines, $$[\text{Net } E=\text{high]\&[Net } E=\text{high}] \qquad (j)$$

Upon further reduction, the net analyzer 100 determines the logic expression (j) may be represented by a single equation, "Net E=high". As Net E 301 may go high, the net analyzer 100 determines that the above hypothesis, represented by equation (e), is true, thereby, the Net J 305 may float, and thus the gate of device 340 may float.

In one embodiment, the net analyzer 100 refers to a logic table and/or a lookup table (not depicted). Some logic devices represented in the lookup table include, a PFET, an NFET, a PFET-based diode, an NFET-based diode, a resistor, and the like. The lookup table contains conditions for logic devices to obtain a specific output. For example, the table for a resistor has a condition for an output to be similar as an input, that is, high in yields high out, which may be symbolically represented by: B=0→A=0; B=1→A=1; B=z→A=z. The symbols A and B represent abstract names, "1" is high and "0" is low and "z" represents "float." For FET devices, G is a gate. A PFET has the conditions/outputs B=0→false; B=1→A=1 & (G=0|G=z). An NFET has the conditions/outputs A=0→B=0 & (G=1|G=z); A=1→false; A=z→B=z|G=0|G=z. A PFET-based diode has the conditions/outputs when S/D=1→G=1 (that is the diode will bleed up to 1). An NFET-based diode has a conditions when S/D=0→G=0 (diode will bleed down to 0).

An example of the truth table produced by the analysis of FIG. 3 is shown as inset (360). Here the inputs are A (362) and B (364), the internal state of the suspect gate is NX (366), and the output is Y (368). Here, for example, the software can apply finite state permutations to the inputs A (362) and B (364), consider the transistors as switches, and allow the circuit state to settle. For I/O ports, the software can wait for the circuit to settle and then attempt to read the port. Here the assumption can be that if no value is present, than that I/O port should be used as an input.

The software can then build a truth table of inputs and the resulting output values (360). If the software finds that an internal gate reaches a floating state or if the node reaches a contention during this time, this result can be added to the truth table, along with the inputs that generated this condition. In the case of clocked circuits, where the settled state may be indeterminate, this can also be remembered in the truth table.

Figure 3B:
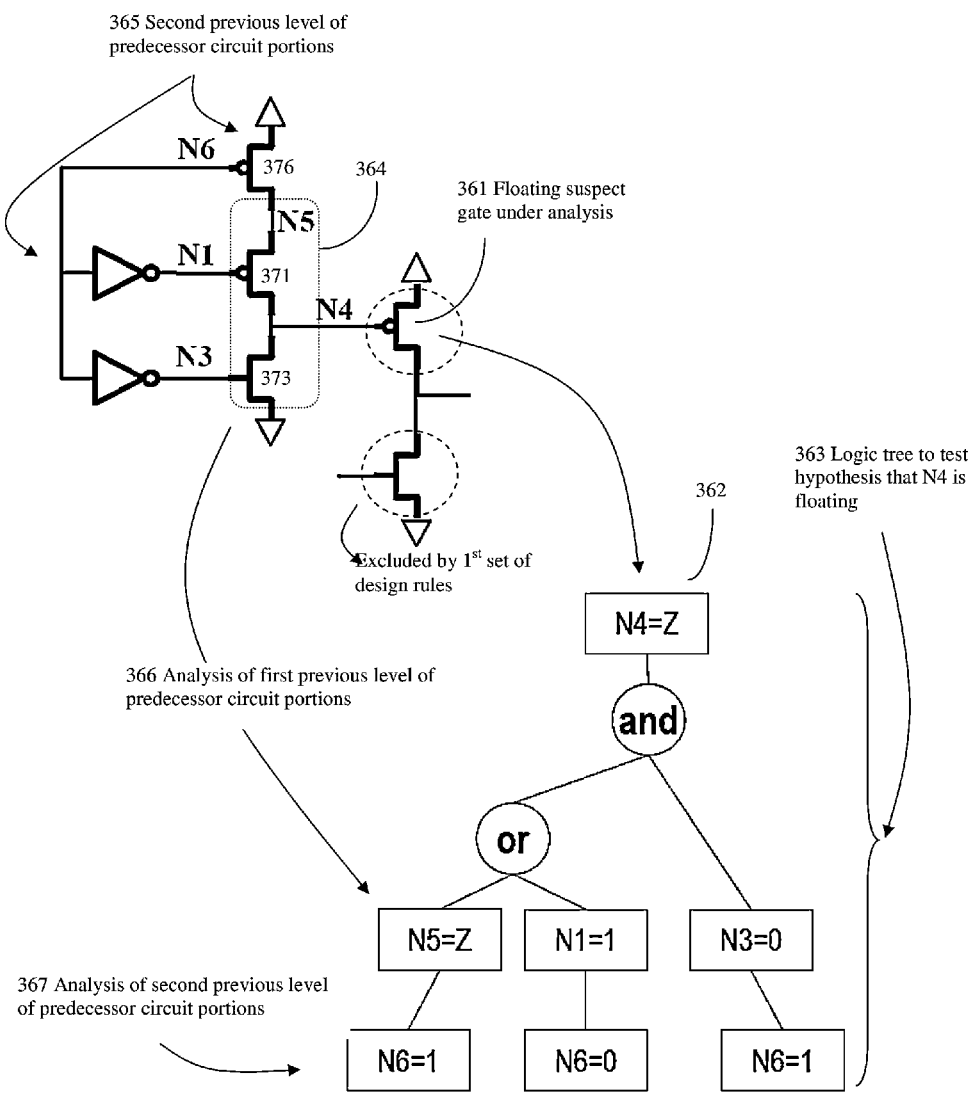
FIG. 3B illustrates an example to show how the invention's methods operate by repeatedly selecting a floating suspect gate node from the portion of the circuit or net of interest, and working backward from this selected floating suspect gate node. The invention analyzes various levels of predecessor circuit portions, and constructs, for each selected floating suspect gate node analyzed, a logic tree to test the hypothesis that this particular floating suspect gate node is in fact floating.

FIG. 3B illustrates an example to show how the invention's methods operate by repeatedly selecting a different floating suspect gate from the portion of the circuit or net of interest, and working backward from this selected floating suspect gate. The invention analyzes various levels of predecessor circuit portions, and constructs, for each selected floating suspect gate analyzed, a logic tree to test the hypothesis that this particular floating suspect gate is in fact floating.

In this example, assume that node N4, having the gate of transistor 361, has passed the first level screening, and has been designated as a floating suspect. The software sets the root or trunk (362) of the logical tree (363) with N4=Z, and begins analyzing the next (1$^{st}$ level) layer of circuitry (364), which in this case is transistors 371 and 373. Essentially the software is evaluating the truth of the hypothesis that N4 has an undefined "Z" level (i.e. N4 is floating) under certain input conditions.

Here the invention essentially acts to transfer the floating gate analysis out of the circuit domain, where floating gate analysis is difficult, and into a more mathematical logic tree traversal domain (363), where the floating gate analysis is now much simpler. Again the software analysis is always focusing on the question: "How do I (or can I) make a particular floating suspect gate reach a defined Z (floating) state?"

In the first layer of the tree (364), given this particular circuit configuration, the invention's analysis software (using, for example, the second set of design rules) can determine that to make node N4=Z (float), then all devices leading into N4 must be off. That is, transistors 371 and 373 must be conducting no current. Thus the question at this first logic tree layer or level becomes one of: is there a circuit state where both transistors 371 and 373 are off? Here the second set of design rules will show that for this particular portion of the circuit, to make transistor 371 off, either N1 must be "low", or N5 must be "floating" (366).

As more and more circuits that feed into other circuits that eventually feed into the particular floating suspect gate (here N4 361) are analyzed, the system produces a growing tree of simplified circuit equations, where each different floating suspect gate being analyzed will generate its own particular logic tree. These simplified circuit equations (e.g. second set of design rules) do not need to be as accurate or sophisticated as what might be obtained using dedicated circuit simulators, such as SPICE, because the analysis is looking for a floating, or high-impedance state, which is the absence of any current, and is therefore dependent on the binary condition of "no current" versus some amount of current. Therefore, the circuit equations mainly consider the transistors to be acting like on-off switches. Thus instead of complex binary math, the logical tree calculations can often be based on simpler Boolean decision making.

As the analysis software continues to build up more and more logic tree levels about any given floating suspect gate of interest, eventually enough data will accumulate so that the software can verify the truth of the hypothesis that this particular floating suspect gate node being analyzed (N4) is floating (=Z) or not (e.g. reporting the truthfulness). Here, for example, the next 2$^{nd}$ level of analysis on the logic tree will analyze (367) the effect of the second previous level of predecessor circuit portions (365) such as gate N6, on the states of the 1st level of circuitry (364). As before, the 1$^{st}$ level of circuitry is again controlled by the states of N5, N1, and N3. Further, as previously discussed, the states of N5, N1 and N3 may then make N4 floating under certain conditions. This type of analysis can go back as many levels as desired, even as far back as 5, 10, 20 or more levels as needed.

Figure 3C:
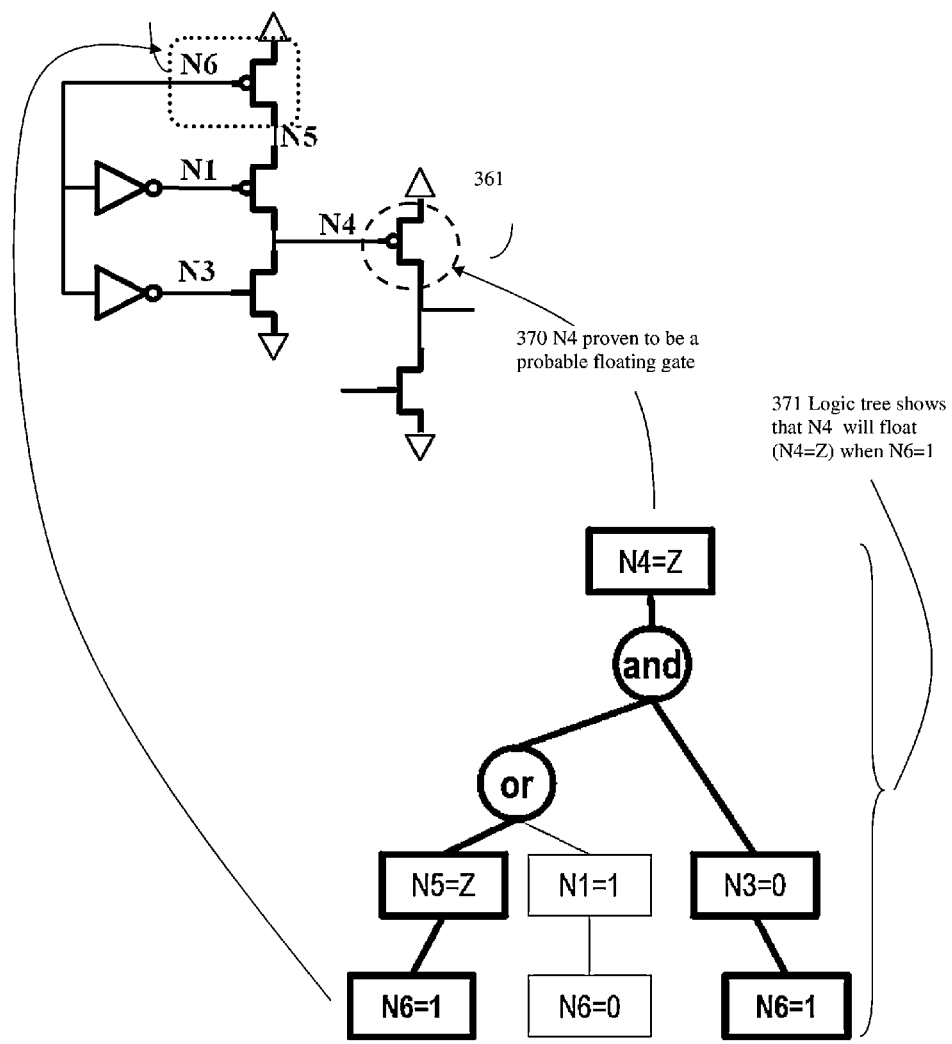
FIG. 3C further illustrates the example from FIG. 3B where the invention has back analyzed FET gate node N4 through two levels of predecessor circuits that feed into this particular floating suspect gate node of interest. The invention represents the function of these predecessor components using simplified equations, and an N4 based logic tree. This logic tree will be different for every floating suspect gate node analyzed. Here the invention has used the N4 based (rooted) logic tree to determine that the floating suspect gate node "N4" will float whenever a second level predecessor component, node N6 delivers a logical 1 signal. Thus N4 has now been determined to be connected be a floating gate node, and the system has also determined that N6 is at least part of the probable cause (failure point) for why N4 floats.

FIG. 3C further illustrates the example from FIG. 3B where the invention has now back analyzed gate N4 (361) through two levels of predecessor circuits (364), (365) that feed into this particular floating suspect gate of interest (361). The invention represents the function of these predecessor components using simplified equations (366, 367), and an N4 based logic tree. This logic tree will be different for every floating suspect gate analyzed. Here the invention has used the N4 based (rooted, or trunk) logic tree (363, 371) to determine that the floating suspect gate "N4" will float whenever a second level predecessor component, N6 (365) delivers a logical 1 signal. Thus N4 has now been determined to be a probable floating gate (370), and the system has also determined that N6 is at least part of the probable cause (failure point) for why N4 floats (372).

In addition to identifying N4 as a floating gate, the invention is also very useful because once the invention identifies gate N6 and the surrounding circuitry as the probable cause why N4 floats, the designer (either human or automated) can then examine the N6 circuit region in more detail and determine, for example, that the problem might be solved by adding a pull-up resistor to N6 that will hold N6 at a valid level. Note also in this example that if the designer had just examined the immediate N4 predecessor components, the actual cause of N4 floating would have been missed. Thus this example illustrates how the invention can be particularly useful in pinpointing more distant or less obvious causes of floating gates.

Figure 4:
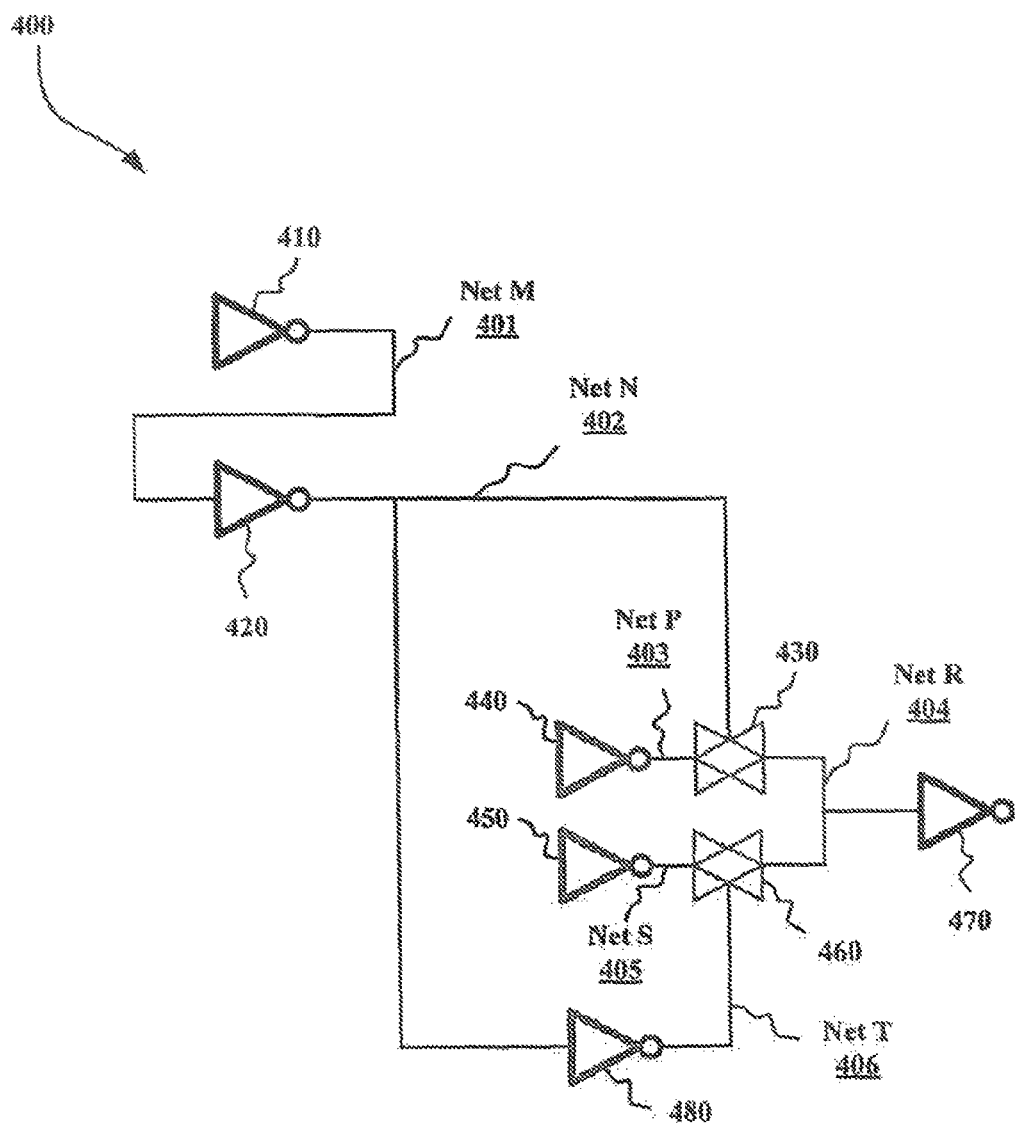
FIG. 4 illustrates another example to show that a node may not float, upon which embodiments of the present invention may be implemented.

FIG. 4 illustrates another example 400 to show a situation when a net may be shown not to float, upon which embodiments of the present invention may also be implemented. The example 400 shows Net M 401 coupled to device 410 and device 420, Net N 402 coupled to devices 420-430 and device

480, Net P 403 coupled to device 430 and device 440, Net R 404 coupled to device 430 and devices 460-470, Net S 405 coupled to device 440 and device 460, and Net T 406 coupled to device 460 and device 480. In the example 400, the net analyzer 100 determines an input to device 470 is suspect, and therefore analyzes Net R 404. To determine if the Net R 404 floats, the net analyzer 100 knows that the devices 440-450, transfer gates, need both be turned off (using determination of truth tables, as described herein), that is control equal 0, or need to have a Z input. Thus, the net analyzer 100 postulates that Net R=Z if:

$$[\text{Net } P=Z] | [\text{Net } N=0] \& [\text{Net } S=Z] | [\text{Net } T=0] \quad (k)$$

The net analyzer 100 knows the inverters have no possible Z output, as determined from earlier findings of truth tables, so the net analyzer 100 knows "Net P 403=Z" is false and "Net S 405=Z" is false. The net analyzer 100 removes the inverter terms from equation K to obtain: [Net N=0] & [Net T=0].

The net analyzer 100 then expands the remaining terms (by working upstream) in equation (1) to by replacing "Net N 402=0" with "Net M 401=1" and replacing "Net T 406=0" with "Net N 402=1". In one embodiment, the net analyzer 100 reviews a history of predetermined nets, such as Net N 402 in example 400, to find a conflicting requirement, that is "Net N 402=0" and "Net N 402=1". As the net analyzer 100 notices that these conflicting terms were "ANDed" without any other possible OR terms, the existence of variable of "Net N 402" in the equation (k) is necessary, and thus may not be reduced, thereby disproving the hypothesis that Net R 404 may float. Thus, using expressions and a hypothesis, the net analyzer 100 proves, in example 400, a net may be in a configuration whereby the net never floats.

Figure 5:
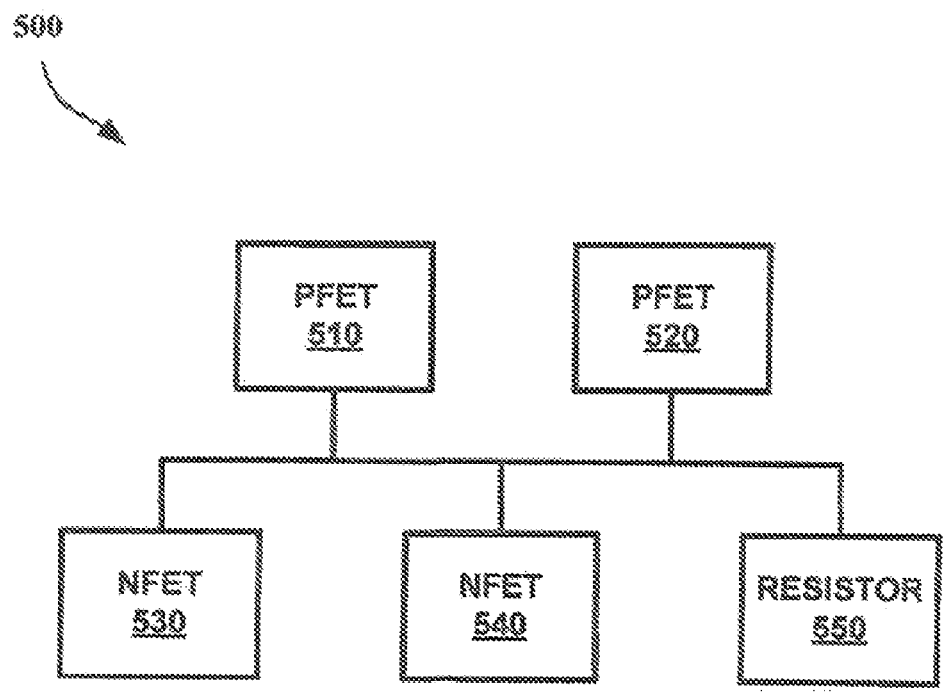
FIG. 5 illustrates an example for detecting floating nodes by combining multiple devices on a single node, upon which embodiments of the present invention may be implemented.

FIG. 5 illustrates an example 500 for detecting floating nets by combining multiple devices on a single net, upon which embodiments of the present invention may be implemented. The example 500 shows Net 505 coupled to a PFET 510, a PFET 520, an NFET 530, an NFET 540, and a resistor 550. In one embodiment, when the net analyzer 100 analyzes a net, the net analyzer 100 considers combinations of several devices based on a lookup table and based on a type of device coupled to the net. For example, if the net analyzer 100 determines if Net 505 is high, then an expression may be used such as: PFET 510=11 PFET 520=1|Resistor 550=1, as any PFET or resistor may pull high. In this situation, the net analyzer 100 does not use expressions for the NFETs 530-540, as the NFET may only pull the Net 505 to 0, and the net analyzer 100 is "optimistic" by looking at every combination where the Net 505 may be high. Additionally, by not including the NFETs, the net analyzer 100 has fewer expressions in the equation.

In one embodiment, when the net analyzer 100 analyzers the Net 505 to be low, the net analyzer 100 may use an expression: NFET 530=0|NFET 540=0|Resistor 550=0, as any NFET or any resistor may pull low. In this situation, the net analyzer 100 does not use expressions for the PFETs 510-520, as an "optimistic" approach is used, discussed above.

In one embodiment, when the net analyzer 100 analyzers the Net 505 to be floating, the net analyzer 100 may use an expression: PFET 510=z & PFET 520=z & NFET 530=z & NFET 540=z & Resistor 550=z. The net analyzer needs to account for all devices that may pull up or down, and as such, needs to check for all devices to be off and/or float.

In another embodiment, the net analyzer 100 determines if any of the FETs are wired as diodes. A diode can pull I/O only if other opposing paths are off, as a diode is a weak bleeder path. In one embodiment, when the net analyzer 100 determines if a net may go high, and where PFET 510 is wired as a diode, the equation may be:

$$[[\text{PFET } 510=1] \& [\text{NFET } 530=z] \& [\text{NFET } 540=z] \& \\ [\text{Resistor } 550=z]] | [\text{PFET } 520=1] | [\text{Resistor } 550=1]$$

In one embodiment, when the net analyzer 100 determines if a net may go low, and where NFET 530 is wired as a diode, the equation may be:

$$[[\text{NFET } 530=0] \& [\text{PFET } 510=z] \& [\text{PFET } 520=z] | [\text{Resistor } 550=z]] | [\text{NFET } 540=0] | [\text{Resistor } 550=0]$$

It will be recognized by one of ordinary skill in the art that any combination of devices may be analyzed by the net analyzer 100, and may be practiced without specific details of the functions within the configuration, and is included within the spirit and scope of the embodiments.

Figure 6:
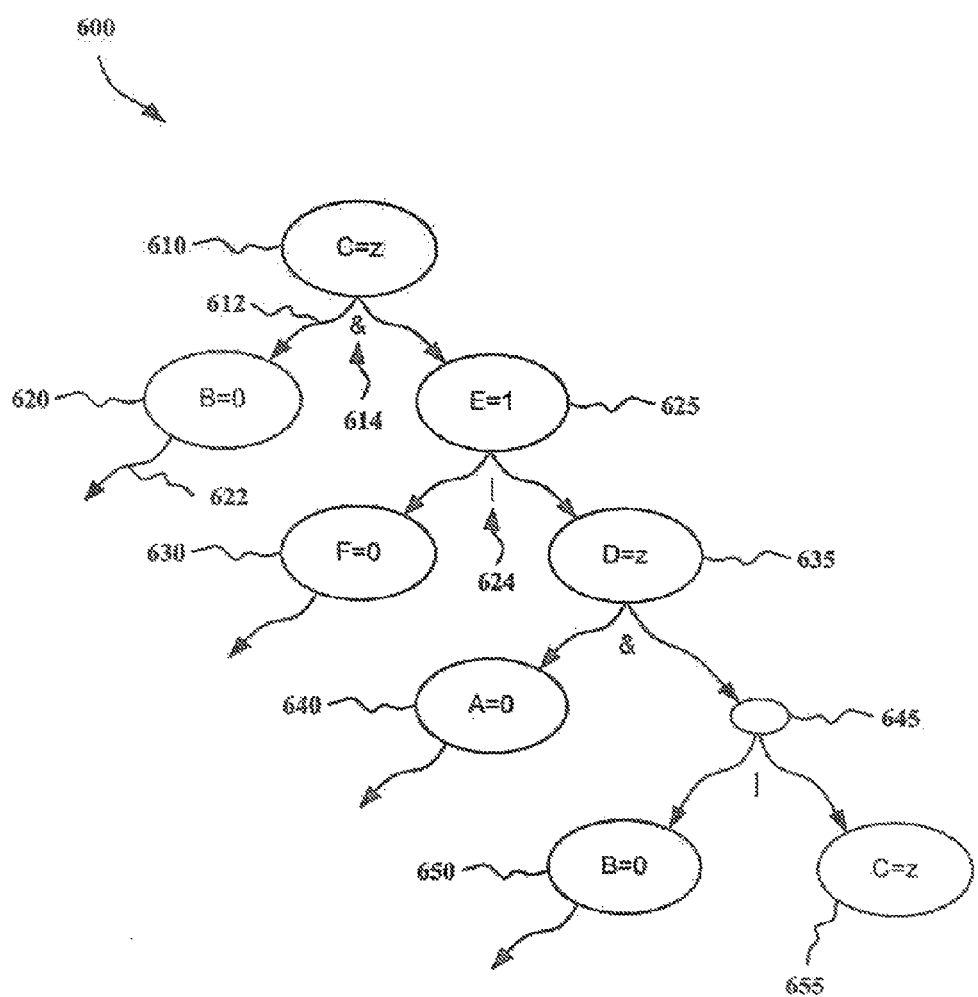
FIG. 6 is a diagram of a tree of a method for detecting floating nodes, upon which embodiments of the present invention may be implemented.

FIG. 6 is a diagram of a tree 600 of a method for detecting floating nets, upon which embodiments of the present invention may be implemented. As illustrated, the tree 600 comprises nodes, such as node 610, relationships, such as relationship 612, and expressions, such as expression 614. The tree 600 is used to illustrate logic expressions, node relationships, and the like. The relationships couple two or more nodes. For example, the relationship 612 couples node 610 and node 625. The expressions are logic dispositions. The tree 600 expands from node 610, a top node, downward as the net analyzer 100 resolves a hypothesis. The top node, the node 610, of the tree 600 contains a hypothesis. The hypothesis is "C=z", that is, "Does net C float?" As the net analyzer 100 progresses down the tree 600, the hypothesis may be either proved or disproved.

From the tree 600, specifically from node 610, node 620 and node 625, the net analyzer 100 determines that C=z if B=0 & E=1. The net analyzer 100 leaves node 620 ("B=0") for now, and explores down node 625, to make a substitution, that is, "E=1 if E=0 OR D=z". From the tree 600, the net analyzer 100 knows the following equations:

$$C=z \text{(hypothesis)}$$

$$C=z \text{ if } B=0 \& E=1$$

$$E=1 \text{ if } F=0 | D=z$$

$$D=z \text{ if } A=0 \& (B=0 | C=z)$$

The net analyzer 100 discovers that the equation, "B=0", appears in two different nodes, node 620 and node 650. In one embodiment, two like expression are called twins. The net analyzer 100 also notices "C=z" appears in the node 610 and node 655. As node 610 represents the hypothesis, this particular twin is assumed to be the actual state.

If unresolved, the net analyzer 100 explores other relationships, such as relationship 627. If the net analyzer 100 finds that "B=0", satisfying node 620 and node 650, and finds that "A=0" is true, then logic of the tree 600 would be satisfied, and the net analyzer 100 has resolved the hypothesis, where C=z. On the other hand, if the net analyzer 100 does not find "B=0" and "A=0", then the net analyzer 100 needs to continue exploring to determine is the tree 600 resolves true or false.

In one embodiment, the net analyzer 100 continues exploring by expanding branches until the tree 600 becomes too large to manage, whereby the net analyzer 100 resolves the hypothesis as a virtual truth. A virtual truth is assumed as a truth for practical purposes. This can be thought of as "guilty until proven innocent", where an intended use of the invention is to apply pessimism and find nodes that may possibly float, not limited to only those nodes which are known to float. The net analyzer 100 may determine if the tree 600 is too large to manage based on computer resources, such as memory or CPU speed, and the like, a predetermined user input, such as a time, and/or based on circuit response characteristics, such as exploring further if fewer or more instances where the hypothesis is not resolved. For example, if during final testing of a circuit, a user requests fewer virtual truths, as opposed to allowing for more virtual truths during initial testing of a circuit.

If the net analyzer 100 finds nodes that repeat, and having different states, then the net analyzer 100 associates this as a conflict. For example, if the node 650 had the state "B=1", not depicted, instead of "B=0", as is the state of the node 620. The conflict may block the logic of the tree 600, and prevent a true from reaching the root. If no other path exist for a true to propagate up without the conflict, then the circuit is proven false, that is the hypothesis is false, and for the tree 600, net C cannot float.

Figure 7:
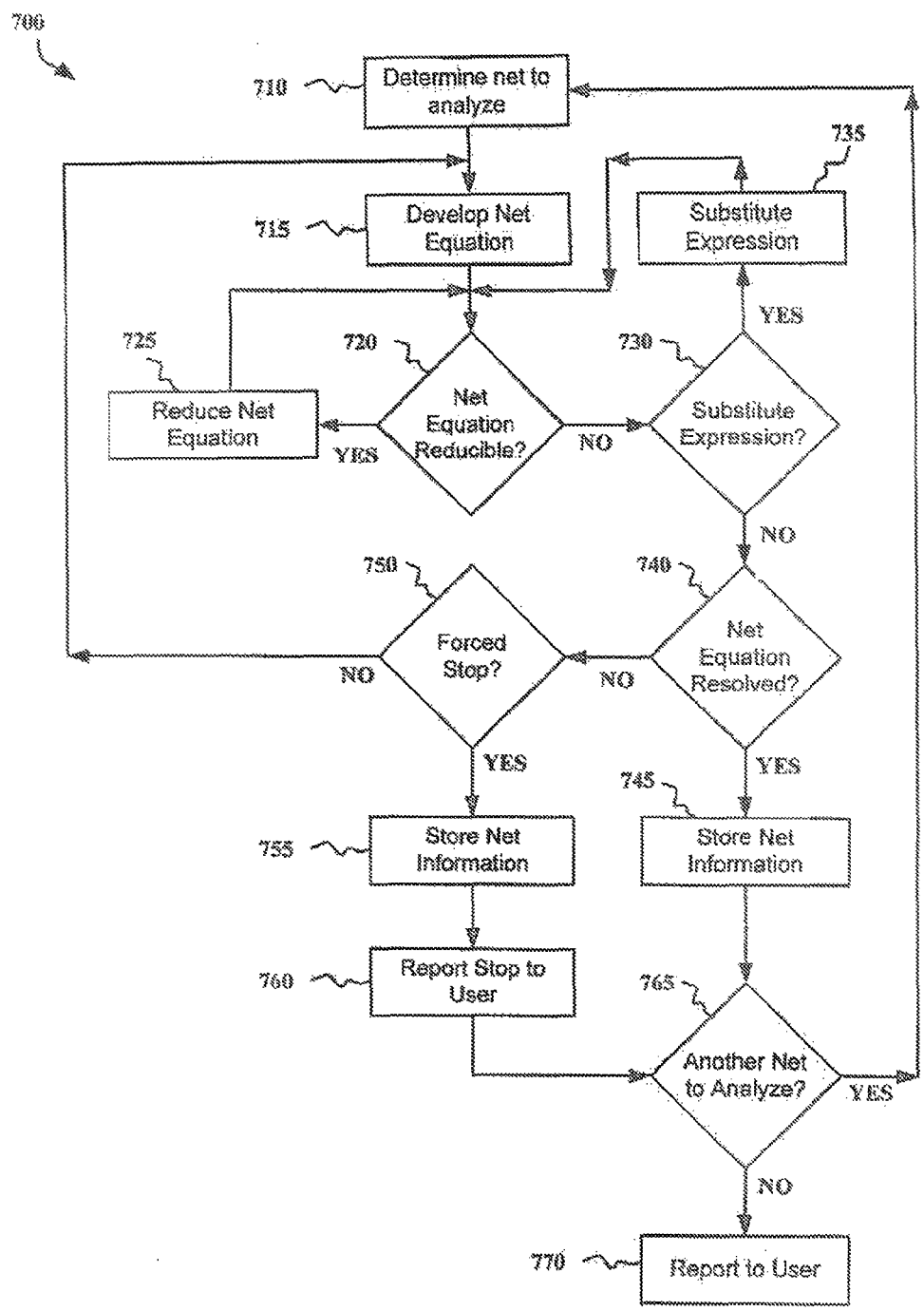
FIG. 7 is a logic diagram of a method for detecting floating nodes, upon which embodiments of the present invention may be implemented.

FIG. 7 is a logic diagram of a method for detecting floating nets, upon which embodiments of the present invention may be implemented. At 710, the net analyzer 100 determines a net to analyze. The determination may be based on suspect nodes, as discussed herein, methodical, or user defined, such as looking at a particular section of a circuit. After the net analyzer determines the net to analyzer, at 715, the net analyzer 100 develops a net equation to represent a state based on a hypothesis, as discussed herein.

At 720, the net analyzer 100 determines if the net equation is reducible, as discussed herein. If the net equation is reducible, then the net equation is reduced at 725 and loops back to check if the net equation may be reduced again at 720. If the net equation is not reducible, at this time, the net analyzer 100 determines, at 730, if a substitute expression may be made, as discussed herein. If a substitute expression may be made, the net analyzer substitutes an expression at 735. If the substitution is made, the net analyzer 100 checks again to determine if the net equation is reducible at 720.

If the net analyzer 100 cannot substitute an expression, at this time, the net analyzer 100 determines if the net equation has been resolved at 740, that is has the hypothesis been proved or disproved, as discussed herein. If the equation has been resolved, information is stored at 745, as discussed here. If the equation has not been resolved, at 750 the net analyzer 100 determines if a forced stop (a predetermined event) is justified, as discussed herein. If the forced stop is not justified, the net analyzer 100 explores another node and develops another net equation at 715, and continues the process. If the net analyzer 100 determines a forced stop is justified, then the net analyzer 100 stores net information at 755, reports forced stop information and any net state information at 760.

After net state information is stored and/or reported at 745 or 760, the net analyzer 100 determines if another net is to be analyzed. If another net is to be analyzed, the net analyzer 100 determines another net equation at 710, and repeats the process until the net analyzer 100 determines there are no more nets to analyze. After the net analyzer 100 determines there are no more nets to analyzer, the net analyzer 100 reports to the user, such as net information, floating nets and/or gates, suspect nets and/or gates, iterations and complexity of net equations, and the like.

Figure 8:
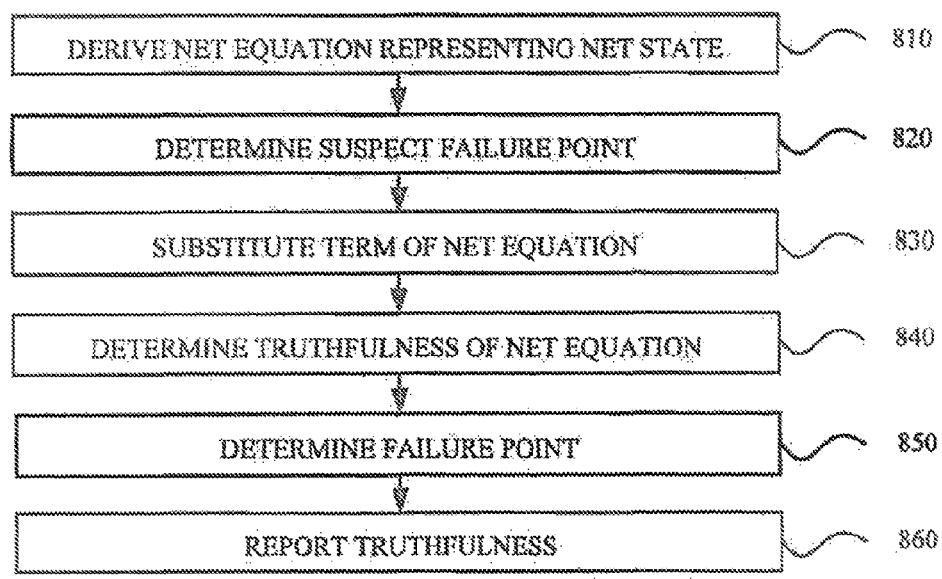
FIG. 8 is a flow chart of a method for detecting floating nodes, upon which embodiments of the present invention may be implemented.

FIG. 8 is a flow chart of a method for detecting floating nets, upon which embodiments of the present invention may be implemented. In step 810 the net analyzer 100 derives a net equation representing a net state of an analog circuit net. The net equation is derived from at least one other net state, as discussed herein.

In various embodiments, the net analyzer 100 determines a suspect failure point (e.g. the probable cause of the floating gate) prior to determining the truthfulness of the net equation. The suspect failure point (or probable cause) is determined based on device configuration, as discussed herein.

After the net equation is derived, the net analyzer resolves the net equation making substitutions, reductions and other approaches as explained in FIG. 7 and herein. In step 830, the net analyzer 100 substitutes a term of the net equation using at least one additional net state. For example, Net 2=1 is substituted with Net 3=0 and Net 4=Z. In various embodiments, the substitution terms are determined as the net analyzer is resolving the net equation. For example, the "Net 3=0" and "Net 4=Z" terms are determined by the net analyzer 100 after reviewing the topology of the circuit. In other embodiments, the net analyzer 100 uses predetermined substitution terms based on previously identified device components and/or configurations. For example, the net analyzer 100 may substitute terms based on a previously identified configuration of devices, and/or previously defined set of devices/configuration. The previously identified configuration may be identified during a previous review of the same devices in a prior resolution of a different net equation or a prior branch of the same net equation. The previously defined set of devices/configuration may be pre-assigned by a user. For example, a user defines a configuration of diodes, a PMOS transistor and a NMOS transistor to have a particular net state.

After the net equation is derived, the net analyzer resolves the net equation and determines the next course of action. In step 840, the net analyzer 100 determines the truthfulness of the net hypothesis, as defined in FIG. 7 and herein. After the net equation is resolved and the truthfulness determined, the net analyzer 100 tests the hypothesis to determine any circuit issues, such as a failure point.

In step 850, the net analyzer 100 determines a failure point. In various embodiments, a user may identify a potential failure point and request the net analyzer 100 to determine that the potential failure point is a failure point. A failure point is any point, net, or device that will cause a circuit to fail, and/or generate an unexpected result. Some examples of failures or unexpected results are current leaks, shorts, driver contention, using floating values as inputs, and the like. In other embodiments, the net analyzer 100 determines and reports failure points independent of any user identified potential failure points, that is the net analyzer 100 review the entire circuit and determines any and/or all failure points. In one embodiment, a truthfulness indicated a failure point, for example, if Net M floats, and the net analyzer 100 determines Net M to float (a true hypothesis), then the net analyzer determines the truthfulness to be a failure point. A true hypothesis does not necessarily correlate to a failure, as "Net N=Z" may have no effect as a failure point.

In various embodiments, the failure point is determined with one evaluation of the net equation. The net analyzer 100 may determine a failure point for one evaluation of one net equation, where the evaluation may take several iterations of the substitutions, reductions, and the like, as detailed in FIG. 7 and herein.

In various embodiments, the failure point is determined with a high degree of certainly, approaching or even equaling 100% (e.g. absolute logical certainty, or a mathematical "proof" level of certainty). The net analyzer 100 may determine such high degrees (mathematical "proof" level) of certainty, because a hypothesis may be logically determined to be true or false with no uncertainty (e.g. logical certainty). This is unlike other circuit analyzers that are time dependent, where an analysis is performed with an estimated certainty, such as 99.99%, as determined by a time and/or cycle iteration variable wherein a circuit does not fail. As the net analyzer 100 uses a logical hypothesis to determine a net equation, the net analyzer 100 resolves net equations and determines failure points independent of a time domain variable. In various embodiments, the net analyzer 100 determines all the failure points in an analog circuit.

In various embodiments, the net analyzer 100 determines failure points with only a user input of power rail definitions. A power rail definition is defining a power to a specific voltage or range of voltages, such as a range of −1 to +2 volts. In other embodiments, the user defines input/output voltages and/or currents of one or more devices and/or power rails.

In various embodiments, the net analyzer 100 predicts a certain net state will not occur. For example, the net analyzer 100 predicts and determines a net will not float, and/or not be a failure point. In various embodiments, the net analyzer 100 determines and/or predicts a device state signal is float, on or off. Depending on the device type, the net analyzer 100 predicts, based on net equation resolution, the device state. For example, the net analyzer 100 predicts and determines a PMOS transistor to be on.

In step 860, the net analyzer 100 reports the truthfulness and/or failure points to the user, as discussed herein. Based on the user requirements, and/or the net analyzer 100, reports may vary to report failure points, net states, potential failure points, and the like. Potential failure points may occur when a net equation of not resolved definitely, but when a predetermined event, such as a forced stop, occurs, as discussed herein.

Figure 9:
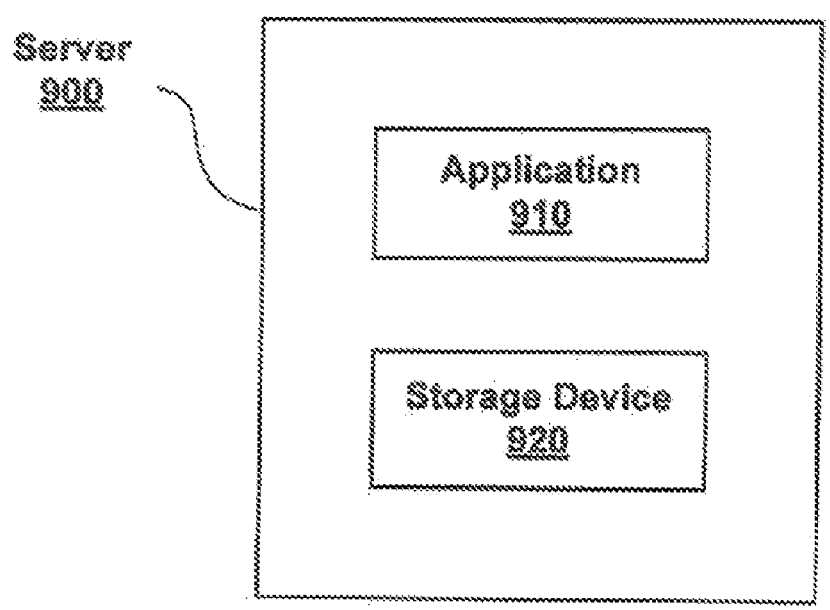
FIG. 9 illustrates a server, upon which embodiments of the present invention may be implemented.

FIG. 9 illustrates a server 900, upon which embodiments of the present invention may be implemented. As illustrated, the server 900 comprises an application 910, and a storage device 920. The application 910 is configured to run on the server, and configured to perform the functions of the net analyzer 100. The storage device 920 is configured to store information, such as net states, net configurations, and/or any other information used for a determination of the social metrics.

In various embodiments, the server 900 contains a computer readable medium having embodied thereon a program, the program being executable by a computing device for performing a method for social capital determination and use. The program is configured to receive circuit configuration information from a user; and return net state information to the user.

Various alternatives, modifications, and equivalents may also be used. For example, the net analyzer 100 may operate remotely or be accessed via a network. In another example, the net analyzer 100 may access multiple CPU located on different computers to perform net state analysis. Therefore, the above description should not be taken as limiting the scope of the invention which is defined by the appended claims.

Figure 10:
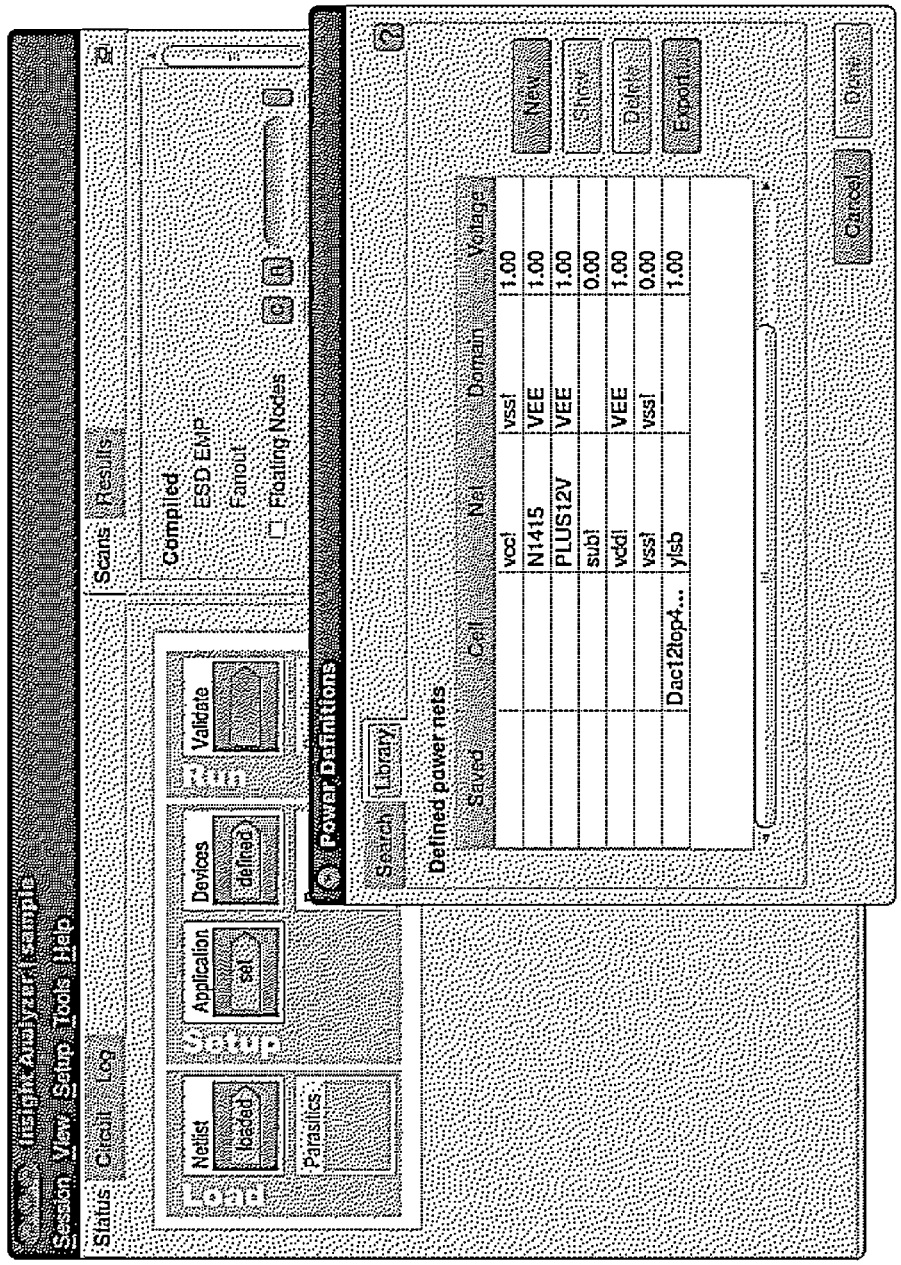
FIG. 10 shows a screenshot showing the invention's software in operation. Here the user is entering in the analysis parameters for the particular circuit of interest.

FIG. 10 shows a screenshot showing the invention's software in operation. Here the user is entering in the analysis parameters for the particular circuit of interest.

FIG. 10 shows the software's setup phase. Here the user is entering in the definitions of the circuit's power supply nets. Power supplies, and entering in power supply information, is usually a required step in analyzing floating gates. This is because the basic definition of "float" is that no power reaches the gate. Therefore, the places were power exists (or doesn't exist) in the circuits are thus of crucial importance to the analysis. In this screenshot, the user is entering in the names of the power nets, as well as the voltages these power nets hold during normal circuit operation.

By analogy to the popular mystery board game "Clue", in FIG. 10, the user is entering in the room layout of the board, the suspects, multiple possible victims (unlike Clue, which only has one victim), and possible weapons.

Figure 11:
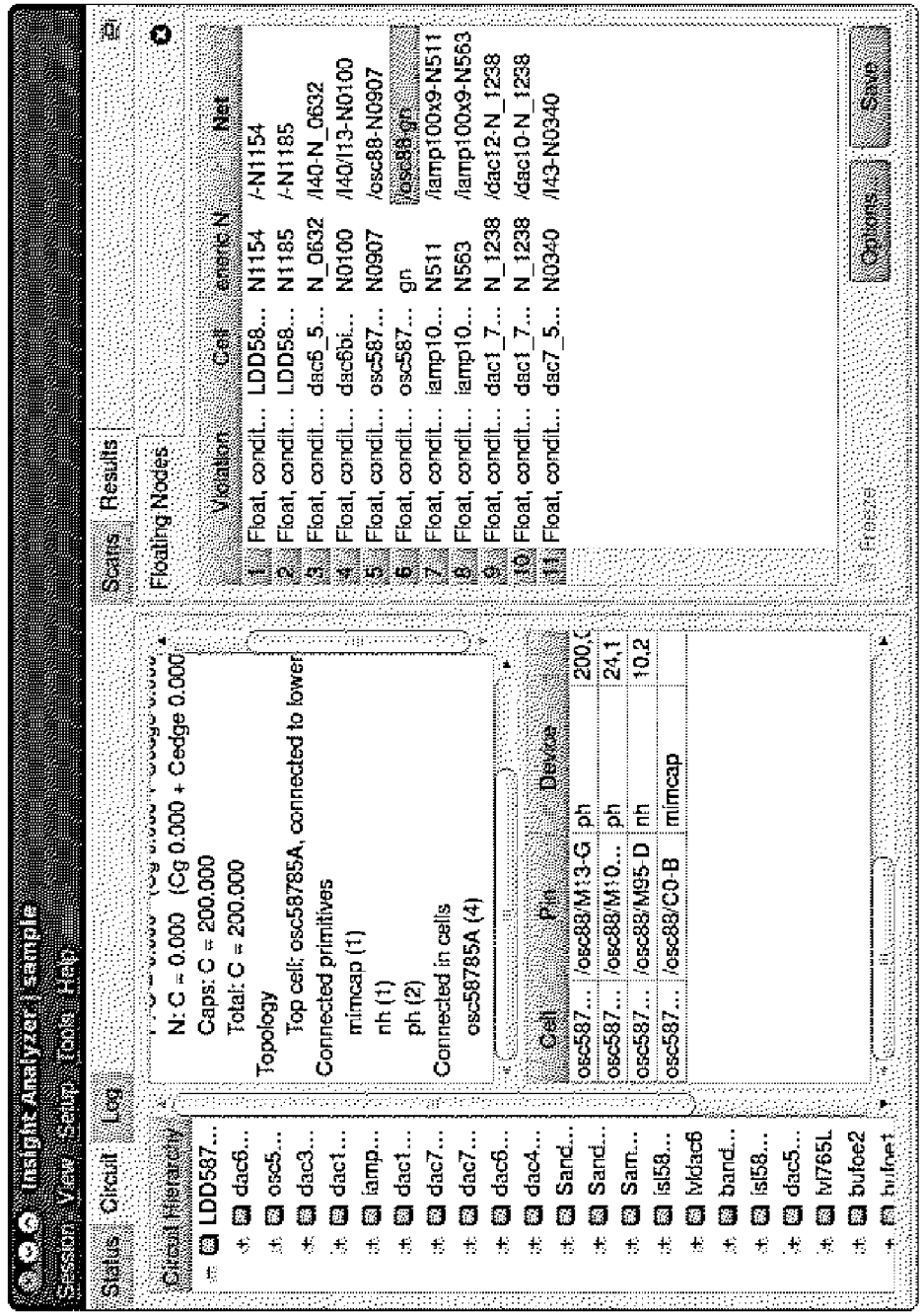
FIG. 11 shows a screenshot showing the invention's software in operation. Here a probable floating gate node is being reported.

FIG. 11 shows a screenshot showing the invention's software in operation. Here a probable floating gate is being reported.

In FIG. 11, the circuit analysis has been completed, and the reported floating gate(s) are shown in a tabular list format. To obtain more information about a particular floating gate of interest, the user can click any one of the floating gates (line items), and see more details of that specific floating gate. This information can include items such as the floating gate's location or point in the overall circuit, the full path used to reach that net or device, and so on.

Again by analogy to "Clue", here the murder victim(s) are being reported, along with what room they were killed in, and other information.

Figure 12:
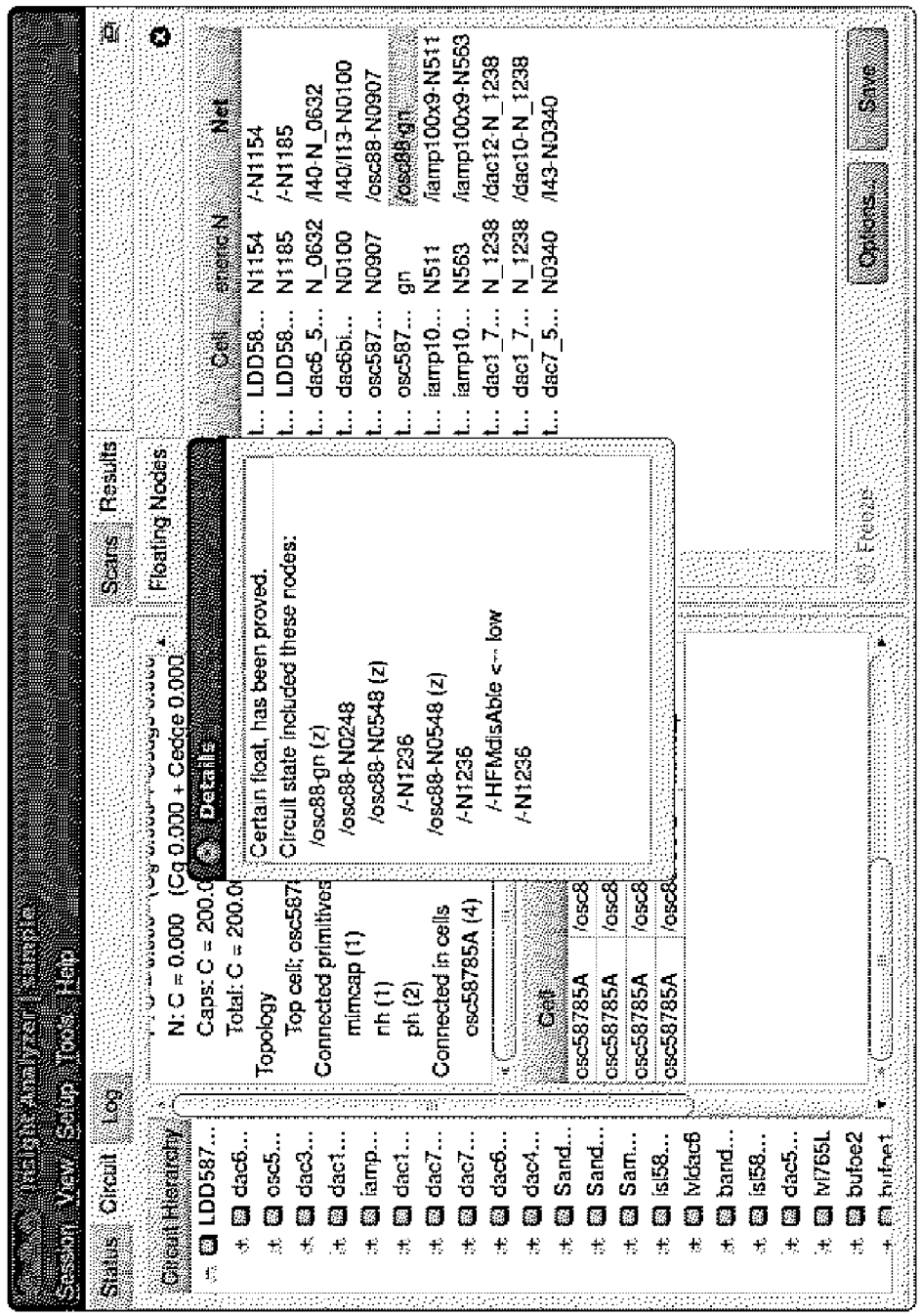
FIG. 12 shows a screenshot showing the invention's software in operation. Here a probable cause for a floating gate node is being reported.

FIG. 12 shows a screenshot showing the invention's software in operation. Here a probable cause for a floating gate is being reported.

Specifically, FIG. 12 provides additional information as to what made this particular gate a floating gate. Here the user has clicked on a floating gate of interest (see FIG. 11 above), and now sees the reduced set of nets (i.e. zooming in to the most relevant nets) that relate to that selected floating gate of interest. This additional information can include nearby connections, as well as nets that either A) drive the signal to the floating gate and/or B) control the on/off state of other that then in turn drive signal to the floating gate.

The software then helps the designer (user) see which of the many various circuit nets are most relevant to the problem by presenting a reduced set of nets, which again represent the nets responsible or relevant as being the "cause" of this particular floating gate. In this reduced set of nets, each net is shown with a state that is necessary/involved with the ultimate outcome of the floating gate, such as "net1=low and net2=high and net3=Z . . . leading to netG=Z". In other words, the software is showing specifically which of the various nets are actually causing the floating gate problem, and also what state that this particular "bad net" was in to generate the floating gate problem.

Again by analogy to "Clue", here the software is reporting who killed the victim(s). Here the output is somewhat like "Colonel Mustard in the Billiard Room with a Candlestick" (at least if only one net was reported).

Once the designer knows what net(s) actually caused the floating gate problem and how, then fixing the floating gate problem is then usually comparatively simple and straightforward.

Further Discussion:

One aspect of the invention is to query the state of various electronic devices that are connected into a larger circuit or net by a particular topology, circuit diagram, or netlist. Here some of the basic topological and circuit analysis aspects of the invention will be discussed in further detail.

Basics of a Topological Check

Almost any topological check, such as the various floating gate checks previously described, begins with the basic notion of a connection: A particular device, such as a gate, is connected to another particular net. Often the connection will be a direct, first order relationship. Other times this connection will be indirect, passing through, for example, a device such as a resistor. In any case, the engineer wants to find such relationship: A particular connection that may be direct or indirect.

Need for State

As previously discussed, frequently, a device, such as transistor, may have connections that lead to an apparent problem, but in fact, a more intelligent understanding of the circuit would indicate that the apparent problem is not actually a problem, given an impossibility of circuit state. For example: A transistor may connect to a resistor, which, in turn, connects to a source of high voltage. Through an inspection of the direct connections, this situation may appear to be a problem, due to high voltage reaching the transistor through the path formed by the resistor. However, upon further, more detailed inspection, it may be discovered that yet more resistors are also connected to the same circuit, forming a voltage divider, and thereby preventing the full extent of high voltage from reaching the transistor. Such a case would be a false positive, if reported to the user.

In another example, a victim device may connect through a transistor to high voltage. The path through the transistor would then appear capable of transmitting the high voltage to the victim device, and initial inspection of the circuit could be expected to result in a positive report of trouble. However, if the gate of this voltage-transmitting transistor is tied to some low voltage source, the transistor would then be expected to regulate the high voltage down to a safe level, forming a pass regulator, and thereby providing a reasonable voltage to the victim device. This is an example of another false positive trouble report that can be eliminated if the circuit is further inspected beyond the initial observations.

Thus, it is often necessary to further inspect the circuit, beyond the initially discovered connections, to comprehend the possible circuit states and rule out false positive reports of trouble.

Solve Outward

One of the basic building blocks of the invention is to query a node for its voltage. If the node is defined as a power or ground rail, then the result of the query is simply the defined voltage. If the node is not a defined power or ground rail, then the voltage is not known and it is necessary to look at the devices connected to this node.

For any connected device on the node, if capable of transmitting voltage, the opposite side of the device is retrieved. For example, a resistor takes us from one pin (the original node) to the opposite pin of the same transistor. Once at the opposite pin, the node connected to that pin is queried for its voltage. If the voltage is known, it is applied to the given node. This process repeats for (a) as many pins as might be on such transmitting device, and (b) for as many transmitting devices as might be on the given node. There may be constructed a "decision tree" or "logical tree", a representation of the circuit in a structure that provides for the relationships of circuit nodes and devices pertaining to the propagation of voltages or states.

Where the state of an original node under query is desired, the decision tree or logical tree produces equations of logic for each layer, or distance, from the original node. For example, if the state of the original node is thought to be at a high voltage, the first layer equation from the decision tree might indicate that either of two other nodes must be at a high voltage. In turn, a further query, of each of those two nodes, might yield another set of equations indicating a set of devices that must turn on, or nodes that must be in high states, or devices that must not turn on, etc.

Each such layer in the decision tree yields its equation by treating transistors as switches, resistors as shunts, capacitors as isolation, diodes as shunts in a single direction, and other commonly accepted concepts of circuit power propagation. By combining observations of multiple such equations from the decision tree, a final outcome may be determined from logical truth or conflict: For example if two required truths are based on equations that each have variables (node states) in conflict with each other, then either of the two required truths is known to be false, thereby preventing them from satisfying preceding equations that depend on them, thereby ruling out the whole proposal for the state of the original node.

A recursive or iterative process applies these steps until the voltage on the original node is known, or the voltage on the original node is ruled out. In other words, the invention's algorithm continually goes to higher and higher levels in the logic tree until the results of that node (often the floating suspect gate of interest)

There might be encountered a device that limits its voltage propagation, such as a transistor, switch model, controlled voltage source, etc. In such case, an iterative or recursive process must now veer off in the direction of the control circuit path(s), before coming back to the DC transmit path originally being inspected. It may then be found, through inspection of the control circuit path(s), that the limiting device is not expected to fully transmit along the original DC transmit path. This would be indicated by knowing basic behaviors of the device, such as NMOS transistor, PMOS transistor, or a user definition of propagation rules through a switch.

For example, if the device is an NMOS transistor, and its Source output voltage must be known, it is necessary to determine the Gate and Drain voltages. If the drain is connected to a node found to be at 4 volts, and the gate is connected to a node found to be at 2 volts, then the resultant drain voltage is known not to exceed the 2 volt level, being limited by the gate.

During this process, there might also be encountered a node that straddles between multiple DC paths to power or ground rails. In such cases, a complete set of the voltage values is maintained for the node. In certain cases, where it is known that the voltage values will be constant (for example, directly connected through resistors that never change their DC voltage propagation), it may be convenient to calculate a single voltage value for the node, such as would be the case of a resistor divider network.

For example, a series of two resistors extending between power and ground can be expected to form an intermediate voltage at the midpoint node between them. The specific voltage can be determined by applying the appropriate calculations, depending on the resistor values and power rail voltages, and then returned as a numeric result to the original query of the midpoint node.

Solve on Demand

In a further embodiment, the solution of state for one particular device does not depend on solution of state for all other devices. Thus, unlike a simulator, this invention is providing (e.g. determining) circuit state(s) only for the device (e.g. the floating suspect gate) under query, thereby saving a significant amount of time and computing resources. It is therefore possible for the user to query a sub-set of devices that are of particular interest, such as those that might be susceptible to risk, without waiting for a longer, more exhaustive simulation or solving of the state of the whole circuit. Indeed, by using the first set of design rules, previously discussed, large portions of the circuit may be analyzed and determined not to be relevant to the problem at hand.

Returned Results

It is useful to have the numeric voltage values returned as the result of such state query (above), but there are also additional factors that should be returned as well. The names of power rails found are also carried through the propagation, as are the values. When a power rail is encountered, as described above, information such as the voltage value, the distinct name (such as "VDD_X"), the defined value, the value that may be altered (as described above), the name of the portion of the circuit wherein the rail originates, and other such factors, are all recorded together. After propagation back to the device or node originally queried has been complete, these result types are returned as the result of the query. For example, the result of the query might include this information: "Reached VDD_X in block TOP, defined at 2.5 v, effectively reduced to 1.8 v".

It is also useful to know the path that a particular power rail was reached through. As an example, consider that one subject device connects to high voltage through a single low value resistor, while another subject device connects to the same voltage through a long, distant chain of many interrupting devices. When weighing the importance of one of these two subject devices against each other, it might commonly be thought that the latter device was the more important case, as it is connected by the shorter path of a single device. To support this relative ranking, the returned results of the query (above) may include, in addition to the power rail information, the points reached along the path that was found during exploration, as previously described.

A Path Point List is constructed, during the exploration for power rail destinations. As the exploration makes successive, possibly iterative or recursive steps, the points that ultimately do lead to a rail finding are saved in a type of stack, or list. This stack or list of points is then returned as the result of the query, or a follow-on query. For example: A user may ask for the power reaching a given device. An initial result may indicate rail "VDD_X", and the same query or subsequent query may then indicate something of the form "VDD_X is reached through Resistor(A), Resistor(B), Transistor(C)".

Inherently Pessimistic

In one embodiment, the invention may return a list of results that provide a sequence of all possible states, rather than trying to predict one specific state. Returning all possible states can be useful because it is inherently pessimistic: providing a compression of all possible simulation outcomes in a single snapshot result. In the application of electrical rule checking, this is advantageous over simulation: This invention will immediately make obvious, in a single result, whether there is any possibility of the device reaching some unwanted state, such as over-voltage, whereas a simulation provides a timeline of events that must be interpreted through a series of inspections (queries) and is dependent upon the conditions being simulated at that time.

User Definition of Propagating Devices

Devices, such as transistors, may often be assumed to have simple pass-through propagation characteristics for voltage or current. Sometimes however, the user may present a circuit that has more complex characteristics, or the user may want a higher degree of numeric accuracy in the determinations of node voltages. For example, a depletion-mode NMOS transistor may be used as a pass regulator, limiting its output voltage, where the numeric value of the limited output is a function of the gate voltage with some offset value.

In cases such as this, in some embodiments of the invention, the inventions software may supply the user with a way to define, provide, or control the determination of such resultant voltage or current values.

Although, as previously discussed, a common industry practice is to simulate the circuit, for example by running a DC settling analysis so that regulator outputs may be calculated, this is often not a practical way to solve tough floating gate problems. This is because the circuit size may be too large for simulation, the simulation is too slow for the user's requirements, simulation alone is not part of the topological approach the user is employing to validate his circuit, device characteristics are not adequately modeled for a particular simulator, or other such factors. In certain cases, the user will find it more convenient to provide a basic definition of a device behavior.

The definition provided by the user may be in plain language description, or selected from a multiple choice list, or represented with a diagram.

Devices with Constant Pass-Through Characteristics

Certain devices may present a simple pass-through value. The value may be completely the same as an input value (such as a metal jumper with near zero resistance), or completely off (such as a fuse link that is programmed to be open). For devices such as these, in some embodiments, the invention's software may present the user with a binary control, such as a GUI with an on/off button, a variable that is set high or low, or the like.

Certain devices may create a multi-way connection or connections, where a value existing on a particular terminal (node) will be propagated to another terminal or terminals. For example, a device may propagate between two terminals in only one direction. As another example, a device may propagate from one central terminal to two or more output terminals. As another example, a device may propagate from one terminal to certain outputs, and furthermore, propagate from yet another terminal to further other outputs.

For devices such as these, the user is given a way to link, or associate, certain desired terminal(s) with other terminal(s). Such linking or associating may be done with a GUI based diagram, or a listing of names in a text-based table arrangement, or a code procedure using "if"/"else" statements, or the like. As one example, a code procedure may be constructed as shown:

if ($input=="pin_A") then exit "pin_B"

else if ($input=="pin_X") then exit "pin_Y"

which establishes a propagation from terminal pin_A to terminal pin_B, and also from terminal pin_X to terminal pin_Y, thereby propagating the voltage or current value from the given input terminals to the given output terminals.

Devices with Conditional On/Off Characteristics

Certain devices may act as switches, given specific conditions that control them. Such devices would propagate values in a manner dependent on value(s) applied to certain controlling terminal(s). One example of such would be a programmable switch in a gate array or FPGA, where the program state is given by a variable value, a voltage on a terminal, the name of a device, or some other factor.

Devices with Value-Altering Characteristics

Certain devices may alter the values that propagate through them, such as a pass regulator that limits its output voltage. The user is given a means to define the function of such device. One example of such a definition would be a math equation, entered in string form through a GUI, such as "$V(drain)=\min(V(source), (V(gate)-0.45))$"

indicating that the drain voltage result is given by the lower of either: the source voltage or an offset of 0.45 v subtracted from the gate voltage.

Another example of such a definition would be a GUI presenting multiple choices to the user, who selects such choices as "depletion mode", "negative offset", and finally provides a numeric value of such offset.

While the invention is described in conjunction with various embodiments, it is understood that they are not intended to limit the invention to these embodiments. On the contrary, the invention is intended to cover alternatives, modifications and equivalents, which may be included within the spirit and scope of the invention as defined by the appended claims.

The invention claimed is:

1. A computerized software implemented method to identify both specific floating transistor gates and causes of said specific floating transistor gates in an electronic circuit design comprising a plurality of electrically interconnected transistors, said method comprising:
   obtaining said electronic circuit design;
   using at least one computer processor to perform the steps of:
   for at each transistor gate of a plurality of transistor gates for which an analysis is desired, performing a logic expansion to create a logic tree representation of a previous level of predecessor circuit portions that drive a state of said each transistor gate, and determining if any states of predecessor nodes in the previous level of the predecessor circuit portions show up more than once with different values such a logical conflict indicates said each transistor gate does not float;
   repeating said logic expansion for next previous levels of the predecessor circuit portions, seeking logical conflicts within the expanding logic tree representation, until it can be determined that either no predecessor circuit portion can cause said each transistor gate to float, or until a predecessor circuit portion that does cause said each transistor gate to float is identified; and
   if such predecessor circuit portion that does cause said each transistor gate to float is identified, reporting an identity of said each transistor gate as a probable floating gate.

2. The method of claim 1, further comprising using a first set of design rules to analyze said plurality of transistor gates and determine which of said plurality of transistor gates are known to be non-floating, and which of said plurality of transistor gates are floating suspect gates.

3. The method of claim 2, wherein said predecessor circuit portions comprise at least one transistor gate that is different from one of said floating suspect gates.

4. The method of claim 1, further comprising reporting said predecessor circuit portion that does cause said floating suspect gate to float as a probable cause of said probable floating gate.

5. The method of claim 1, further comprising using a second set of design rules to identify floating suspect gates or probable floating gates.

6. The method of claim 1, wherein said states of said predecessor circuit nodes comprise either floating gates and/or determining situations where said predecessor circuit nodes are in contention.

7. The method of claim 1, wherein said logic tree representation is a Boolean logic tree.

8. The method of claim 1, further comprising identifying a floating node to which one of said specific floating transistor gates is connected.

9. The method of claim 1, further repeating said method over a plurality of different transistor gates in an electronic circuit design or a portion of an electronic circuit design of interest.

10. The method of claim 1, wherein said method provides a logical proof to identify that a floating suspect gate is a probable floating gate.

11. A computerized software implemented method to identify both specific floating transistor gates and causes of said specific floating transistor gates in an electronic circuit design comprising a plurality of electrically interconnected transistors, said method comprising:
   obtaining said electronic circuit design;
   using at least one computer processor to perform the steps of:
   using a first set of design rules to analyze said plurality of transistor gates and determine which of said plurality of transistor gates are known to be non-floating, and which of said plurality of transistor gates are floating suspect gates;
   for at each of said floating suspect gates for which an analysis is desired, performing a logic expansion to create a logic tree representation of a previous level of predecessor circuit portions that drive a state of said each floating suspect gate, and determining if any any states of predecessor nodes in the previous level of the predecessor circuit portions show up more than once with different values such a logical conflict indicates said each floating suspect gate does not float;
   repeating said logic expansion for the next previous level of the predecessor circuit portions seeking logical conflicts within the expanding logic tree representation, until it can be determined that either no predecessor circuit portion can cause said each floating suspect gate to float, or until a predecessor circuit portion that does cause said each floating suspect gate to float is identified; and
   if such predecessor circuit portion that does cause said floating suspect gate to float is identified, reporting an identity of said each floating suspect gate as a probable floating gate, and also reporting said predecessor circuit portion that does cause said floating suspect gate to float as the probable cause of said probable floating gate.

12. The method of claim 11, further comprising determining which of said plurality of transistor gates are floating suspect gates by the steps of:
   identifying at least one circuit subsection that is formed from said transistor gates;
   applying finite state permutations to inputs to said circuit subsection;
   electronically simulating a state of the circuit subsection by treating transistor components of said transistor gates as switches, and allowing a state of said transistor components to settle;
   building a truth table of the inputs and resulting outputs, wherein if an internal transistor gate in said circuit subsection is determined to be in a floating state, designating which inputs of said circuit subsection cause said floating state to occur; and
   building a truth table of the inputs and resulting outputs, wherein if an output of said circuit subsection is determined to have continuous non-floating states under all conditions, designating said output for reference in a subsequent analysis.

13. The method of claim 11, further comprising determining which of said plurality of transistor gates to analyze for floating suspect gates by scanning said electronic circuit design for nets that either have FET gates directly connected, or have FET gates reached through resistors, or through FET gates reached through DC passive devices.

14. The method of claim 11, wherein said first set of design rules comprise:
   identifying at least one circuit subsection that includes said transistor gates, and designating as known non-floating gates in said at least one circuit subsection whenever said circuit subsection has a global power source or power ports that cannot generate a floating state.

15. The method of claim 11, wherein said first set of design rules comprise identifying a transistor gate as known non-non floating gate when said transistor gate is tied around to its own transistor to form a diode, or said transistor gate is used with respect to its own transistor's source and drain as a FET capacitor, or said transistor gate has a constant feedback path to its own transistor's power supply, or said transistor gate is part of a transistor that has no possible path to power or ground.

16. The method of claim 11, wherein if said transistor gate is in a floating condition when its transistor is powered off, said transistor gate is not reported.

17. The method of claim 11, wherein said electronic circuit design further comprises a plurality of power rails, further analyzing an effect of switching said power rails on those transistor gates that are provided with a constant power, and searching for victim transistor gates that are affected by said switching, and if said victim transistor gates are found also reporting said power rail switching as a cause of said floating transistor gates.

18. The method of claim 11, wherein analyzing said floating suspect gates is done using one or more circuit behavior equations.

19. The method of claim 11, wherein said logic expansion for the next previous level of the predecessor electronic circuit portions is further biased to narrow the logic tree representation to grow in certain directions and favor logic tree growth in other directions by preferentially favoring the predecessor circuit portions where a transistor leads to power, where a transistor leads to a component at higher risk for floating, and where the transistor source or drain paths are followed before a following gate; and wherein the logic expansion for the next previous level of the predecessor circuit portions is further biased against transistors that do not lead to power or to floating states, or following transistor's gating signal path after first establishing the source or drain paths.

20. The method of claim 11, wherein said logic expansion for the next previous level of predecessor circuit portions is further biased to preferentially avoid entries into logic circuits which do not have a desired outcome possibility being sought at the time, and repetitive instances of similar circuits such as memory bit cells which are connected in highly parallel arrays and usually lead to the same logical outcomes.

21. The method of claim 11, wherein said logic tree representation is a Boolean logic tree representation; and wherein when nodes in the previous level of the predecessor circuit portions are those at ultimate boundaries of a total circuit, said nodes have no predecessors, and thereby have a possibility of holding any circuit state to satisfy Boolean conditions at their places in said logic tree representation.

22. The method of claim 11, wherein if said logic expansion is unable to establish that a floating transistor gate exists within a preset depth in said logic tree representation, then either halting the analysis at a preset maximum depth level, and listing some or all of leaf nodes at said preset maximum depth level, and reporting said floating suspect gate as having a possibility of floating.

23. The method of claim 11, further comprising using a second set of design rules to identify floating suspect gates or probable floating gates.

24. A computerized software implemented method to identify both specific floating transistor gates and causes of said specific floating transistor gates in an electronic circuit design comprising a plurality of electrically interconnected transistors, said method comprising:

obtaining said electronic circuit design;

using at least one computer processor to perform the steps of:

using a first set of design rules to analyze a plurality of transistor gates and determine which of said plurality of transistor gates are known to be non-floating, and which of said plurality of transistor gates are floating suspect gates;

wherein determining which of said plurality of transistor gates are floating suspect gates is done by the steps of:

identifying at least one circuit subsection that is formed from said transistor gates;

applying finite state permutations to inputs to said circuit subsection;

electronically simulating a state of the circuit subsection by treating transistor components of said transistor gates as switches, and allowing the state of said transistor components to settle;

building a truth table of the inputs and resulting outputs, wherein if an internal transistor gate in said circuit subsection is determined to be a floating state, designating which inputs of said circuit subsection cause said floating state to occur;

building a truth table of the inputs and resulting outputs, wherein if an output of said circuit subsection is determined to have continuous non-floating states under all conditions, designating said output for reference in a subsequent analysis;

wherein analyzing said floating suspect gates is done using one or more circuit behavior equations;

for at each floating suspect gate of said floating suspect gates for which an analysis is desired, performing a logic expansion to create a logic tree representation of a previous level of predecessor circuit portions that drive a state of said each floating suspect gate, and determining if any states of predecessor nodes in the previous level of the predecessor circuit portions show up more than once with different values such a logical conflict indicates said floating suspect gate does not float;

repeating said logic expansion for the next previous level of the predecessor circuit portions, seeking logical conflicts within the expanding logic tree representation until it can be determined that either no predecessor circuit portion can cause said each floating suspect gate to float, or until a predecessor circuit portion that does cause said each floating suspect gate to float is identified; and if such predecessor circuit portion that does cause said each floating suspect gate to float is identified, then reporting an identity of said each floating suspect gate as a probable floating gate, and also reporting said predecessor circuit portion that does cause said each floating suspect gate to float as a probable cause of said probable floating gate.

25. The method of claim 24, further comprising using a second set of design rules to identify floating suspect gates or probable floating gates.

* * * * *